United States Patent
Kim et al.

(10) Patent No.: US 11,647,649 B2
(45) Date of Patent: May 9, 2023

(54) ORGANIC LIGHT EMITTING DISPLAY DEVICE WITH OPENINGS IN BANKS IN A DUMMY AREA

(71) Applicant: LG Display Co., Ltd., Seoul (KR)

(72) Inventors: Seong-Hyun Kim, Paju-si (KR); Jae-Ki Lee, Paju-si (KR); Jeong-Won Lee, Paju-si (KR); Chang-Yong Gong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 217 days.

(21) Appl. No.: 17/119,712

(22) Filed: Dec. 11, 2020

(65) Prior Publication Data

US 2021/0183973 A1 Jun. 17, 2021

(30) Foreign Application Priority Data

Dec. 11, 2019 (KR) .................. 10-2019-0165044

(51) Int. Cl.
*H01L 27/32* (2006.01)

(52) U.S. Cl.
CPC ...... *H01L 27/3246* (2013.01); *H01L 27/3211* (2013.01); *H01L 27/3216* (2013.01)

(58) Field of Classification Search
CPC ............ H01L 27/3246; H01L 27/3211; H01L 27/3216
See application file for complete search history.

(56) References Cited

U.S. PATENT DOCUMENTS

| | | | | |
|---|---|---|---|---|
| 2004/0140759 A1* | 7/2004 | Park | ................... | H01L 27/3283 313/504 |
| 2004/0202819 A1* | 10/2004 | Frost | ................... | H01L 51/0005 438/42 |
| 2005/0260335 A1* | 11/2005 | Kimura | ............... | H01L 51/0005 427/164 |
| 2015/0333110 A1* | 11/2015 | Park | ................... | H01L 27/3248 438/23 |
| 2015/0372067 A1* | 12/2015 | Kim | ................... | H01L 27/3223 438/34 |
| 2016/0181335 A1* | 6/2016 | Mori | ................... | H01L 27/3246 257/40 |
| 2020/0194518 A1 | 6/2020 | Myung et al. | | |

FOREIGN PATENT DOCUMENTS

KR 10-2020-0075607 A 6/2020

* cited by examiner

*Primary Examiner* — Peter Bradford
(74) *Attorney, Agent, or Firm* — Fenwick & West LLP

(57) ABSTRACT

An organic light emitting display device includes a substrate including a display area and a non-display area, the display area including a plurality of sub-pixels; an overcoat layer disposed on the substrate; first electrodes disposed on the overcoat layer and in the sub-pixels; a first bank disposed in the display area and the non-display area and including first openings, the first openings respectively exposing the first electrodes; a second bank disposed on the first bank and including second openings in the display area, third openings in the non-display area and fourth openings, the second openings exposing the plurality of first electrodes arranged in the display area, the third openings exposing the first openings arranged in the non-display area, and the fourth openings connecting the second openings and the third openings; and an organic light emitting layer disposed in each of the second openings, the third openings and the fourth openings.

18 Claims, 14 Drawing Sheets

— 1st Bank Boundary
— 2nd Bank Boundary

— 1st Bank Boundary
— 2nd Bank Boundary

— 1st Bank Boundary
━ 2nd Bank Boundary

ORGANIC LIGHT EMITTING DISPLAY DEVICE WITH OPENINGS IN BANKS IN A DUMMY AREA

CROSS-REFERENCE TO RELATED APPLICATIONS

This application claims the benefit under 35 U.S.C. § 119(a) of Republic of Korea Patent Application No. 10-2019-0165044, filed on Dec. 11, 2019, in the Korean Intellectual Property Office, which is incorporated herein by reference in its entirety.

BACKGROUND

1. Technical Field

The present disclosure relates to an organic light emitting display device.

2. Discussion of the Related Art

Recently, various display devices having reduced weights and volumes, which are disadvantages of a cathode ray tube, have been developed. Such display devices include a liquid crystal display (LCD), a plasma display panel (PDP), a field emission display (FED), an organic light emitting display device, and the like.

An organic light emitting display device is a self-emission device that spontaneously emits light and has advantages of a high response time, high emission efficiency, high luminance, and a wide viewing angle. In addition, flexible display devices may be realized because elements may be formed on a flexible substrate such as a plastic substrate.

Recently, as an organic light emitting display device having a large area and high resolution is required, a plurality of sub-pixels are included in a single panel. A mask is generally used for patterning of red (R), green (G) and blue (B) sub-pixels. Accordingly, in order to realize a large-area display device, a large-area fine metal mask (FMM) corresponding thereto is required. However, a mask may sag as the area thereof increases, causing the occurrence of various defects such as non-deposition of an organic light emitting material which forms a light emitting layer at a desired position.

In order to solve the above-described problem of a deposition method using a mask, a solution process which is simple and is advantageous for a large area is attracting interest. The solution process can perform large-area patterning through inkjet printing or nozzle printing without a mask and has a very high material use rate of 50% to 80% compared to vacuum evaporation having a material use rate of below 10%. In addition, the solution process provides a glass transition temperature higher than that of a vacuum evaporated thin film and thus achieves high thermal stability and an excellent morphology characteristic.

SUMMARY

However, when a light emitting layer is formed through the solution process, a thickness deviation according to positions in sub-pixels may cause thickness non-uniformity, and thus there is a problem that the display quality is considerably deteriorated.

Accordingly, the present disclosure is directed to providing an organic light emitting display device having a double bank structure.

According to an aspect of the present disclosure, there is provided an organic light emitting display device including a substrate including a display area and a non-display area at a periphery of the display area, the display area including a plurality of sub-pixels; an overcoat layer disposed on the substrate; first electrodes disposed on the overcoat layer and in the sub-pixels; a first bank disposed in the display area and the non-display area and including first openings, the first openings respectively exposing the first electrodes; a second bank disposed on the first bank and including second openings in the display area, third openings in the non-display area and fourth openings, the second openings exposing the plurality of first electrodes arranged in the display area, the third openings exposing the first openings arranged in the non-display area, and the fourth openings connecting the second openings and the third openings; and an organic light emitting layer disposed in each of the second openings, the third openings and the fourth openings.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

DETAILED DESCRIPTION

Figure 1:
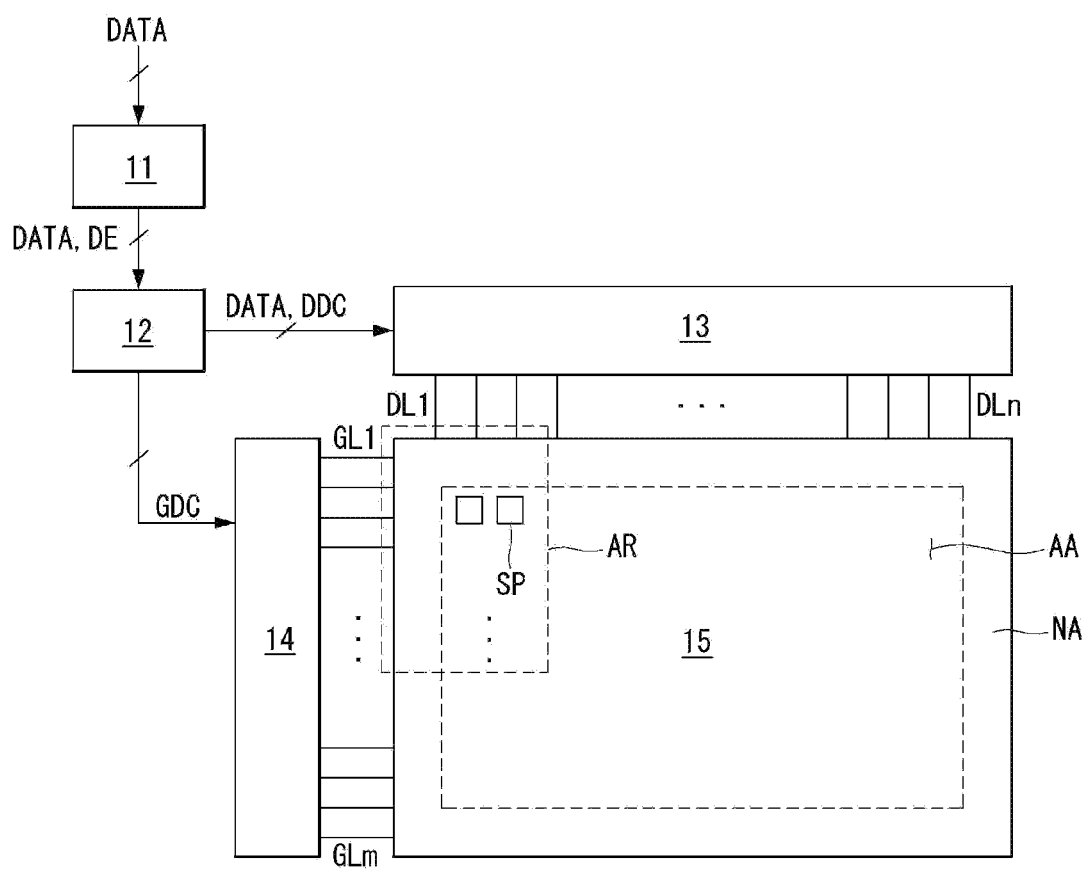
FIG. 1 is a schematic block diagram of an organic light emitting display device according to one embodiment.

Hereinafter, exemplary embodiments of the present disclosure will be described with reference to the accompanying drawings. Throughout the specification, the same reference numeral substantially denotes the same element. In the following description, a detailed description of known technology or element related to the present disclosure will be omitted if it is deemed to make the gist of the present disclosure unnecessarily vague. In describing several embodiments, the same element is representatively described at the introductory part of this specification, and may be omitted in other embodiments.

Terms including ordinal numbers such as the first and the second may be used to describe various elements, but the elements are not limited by the terms. The terms are used to only distinguish one element from another element.

Figure 2:
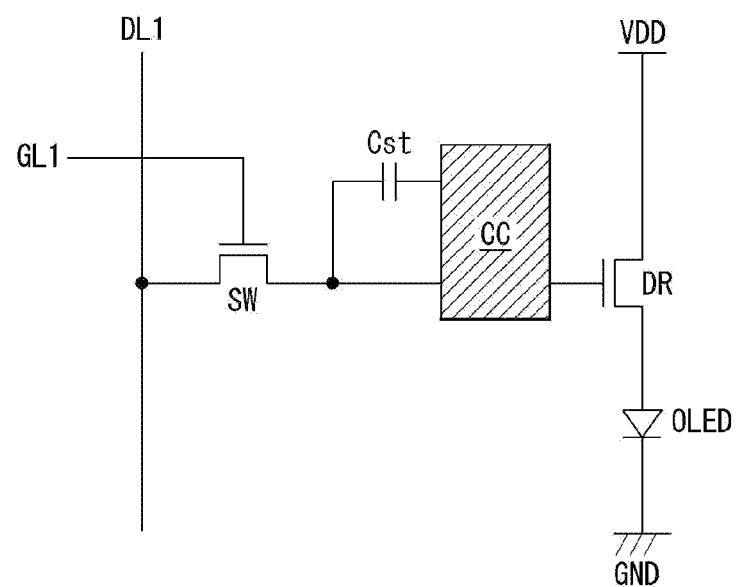
FIGS. 2 and 3 are configuration diagrams schematically illustrating a sub-pixel shown in FIG. 1 according to one embodiment.
Figure 3:
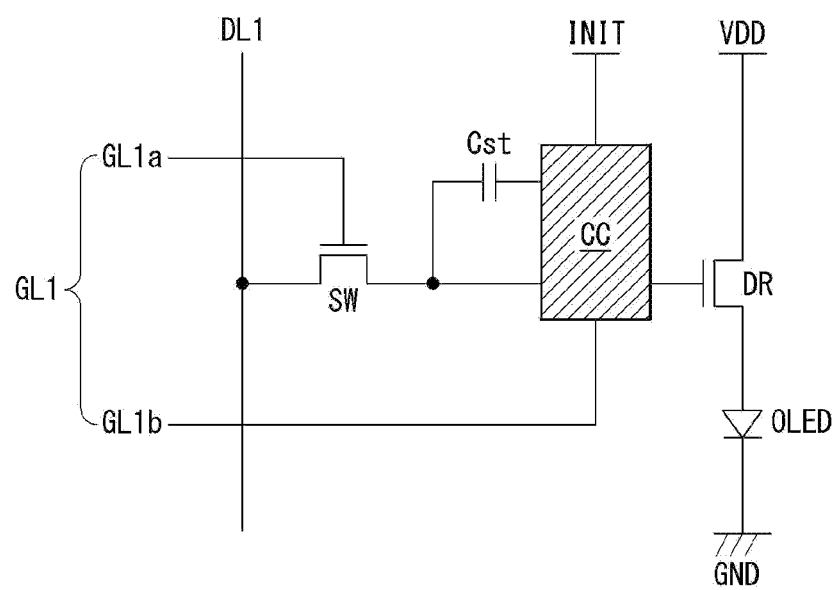

FIG. 1 is a schematic block diagram of an organic light emitting display device. FIGS. 2 and 3 are configuration diagrams schematically illustrating a sub-pixel shown in FIG. 1.

Referring to FIG. 1, the organic light emitting display device includes an image processor 11, a timing controller 12, a data driver 13, a gate driver 14, and a display panel 15.

The image processor 11 outputs a data enable signal DE along with a data signal DATA supplied from the outside. The image processor 11 may output one or more of a vertical sync signal, a horizontal sync signal, and a clock signal in addition to the data enable signal DE, but such signals are not shown for convenience of description. The image processor 11 is formed on a system circuit board in an integrated circuit (IC) form.

The timing controller 12 is supplied with a data enable signal DE or driving signals, including a vertical sync signal, a horizontal sync signal, and a clock signal, along with the data signal DATA from the image processor 11.

The timing controller 12 outputs a gate timing control signal GDC for controlling the operational timing of the gate driver 14 and a data timing control signal DDC for controlling the operational timing of the data driver 13, based on the driving signals. The timing controller 12 is formed on a control circuit board in an IC form.

The data driver 13 converts the data signal DATA, supplied from the timing controller 12, into a gamma reference voltage by sampling and latching the data signal DATA in response to the data timing control signal DDC supplied from the timing controller 12, and outputs the gamma reference voltage. The data driver 13 outputs the data signal DATA through data lines DL1 to DLn. The data driver 13 may be formed on a data circuit board in an IC form and attached to the display panel 15.

The gate driver 14 outputs a gate signal while shifting a level of a gate voltage in response to the gate timing control signal GDC supplied from the timing controller 12. The gate driver 14 outputs the gate signal through gate lines GL1 to GLm. The gate driver 14 may be formed on a gate circuit board in an IC form and attached to the display panel 15 or may be formed on the display panel 15 in a gate-in-panel manner.

The display panel 15 includes a display area AA in which an image is realized and a non-display area NA other than the display area AA. The display area AA includes sub-pixels SP. The sub-pixels may be defined by the intersection structure of signal lines.

The display panel 15 displays an image in accordance with the data signal DATA and the gate signal respectively supplied from the data driver 13 and the gate driver 14. The non-display area NA includes pads to which a circuit board is bonded and which receive a signal from the circuit board and link lines connected to the pads to transfer the signal to the sub-pixels SP of the display area AA.

Referring to FIG. 2, one sub-pixel includes a switching transistor SW, a driving transistor DR, a compensation circuit CC, and an organic light emitting diode (OLED). The OLED operates to emit light in response to a driving current formed by the driving transistor DR.

The switching transistor SW performs a switching operation in response to a gate signal supplied through a first gate line GL1 so that a data signal supplied through a first data line DL1 is stored in a capacitor as a data voltage. The driving transistor DR operates in response to a data voltage stored in the capacitor so that a driving current flows between a high potential power source line VDD and a low potential power source line GND. The compensation circuit CC is a circuit for compensating a threshold voltage or the like of the driving transistor DR. Further, the capacitor connected to the switching transistor SW or the driving transistor DR may be positioned within the compensation circuit CC.

The compensation circuit CC comprises of one or more thin-film transistors and a capacitor. The configuration of the compensation circuit CC is very diverse depending on a compensation method, and a detailed example and description thereof are omitted.

Further, as shown in FIG. 3, when the compensation circuit CC is included, the sub-pixel further includes a signal line, a power source line, and the like for supplying a specific signal or power source, in addition to driving a compensation thin-film transistor. The switching transistor SW performs a switching operation in response to a gate signal supplied through a first gate line GL1a similar to FIG. 2. The added signal line may be defined as a first-second gate line GL1b for driving the compensation thin-film transistor included in the sub-pixel. In addition, the added power source line may be defined as an initialization power source line INIT for initializing a specific node of the sub-pixel with a specific voltage. However, this is only one example and the present disclosure is not limited thereto.

FIGS. 2 and 3 illustrate an example in which one sub-pixel includes the compensation circuit CC. However, when the subject of compensation is positioned outside the sub-pixel such as the data driver 13, the compensation circuit CC may be omitted. That is, one sub-pixel has a two transistorone capacitor (2T1C) structure basically including a switching transistor SW, a driving transistor DR, a capacitor, and an OLED, but may be configured in various ways, such as 3T1C, 4T2C, 5T2C, 6T2C, 7T2C when the compensation circuit CC is added.

First Embodiment

Figure 4:
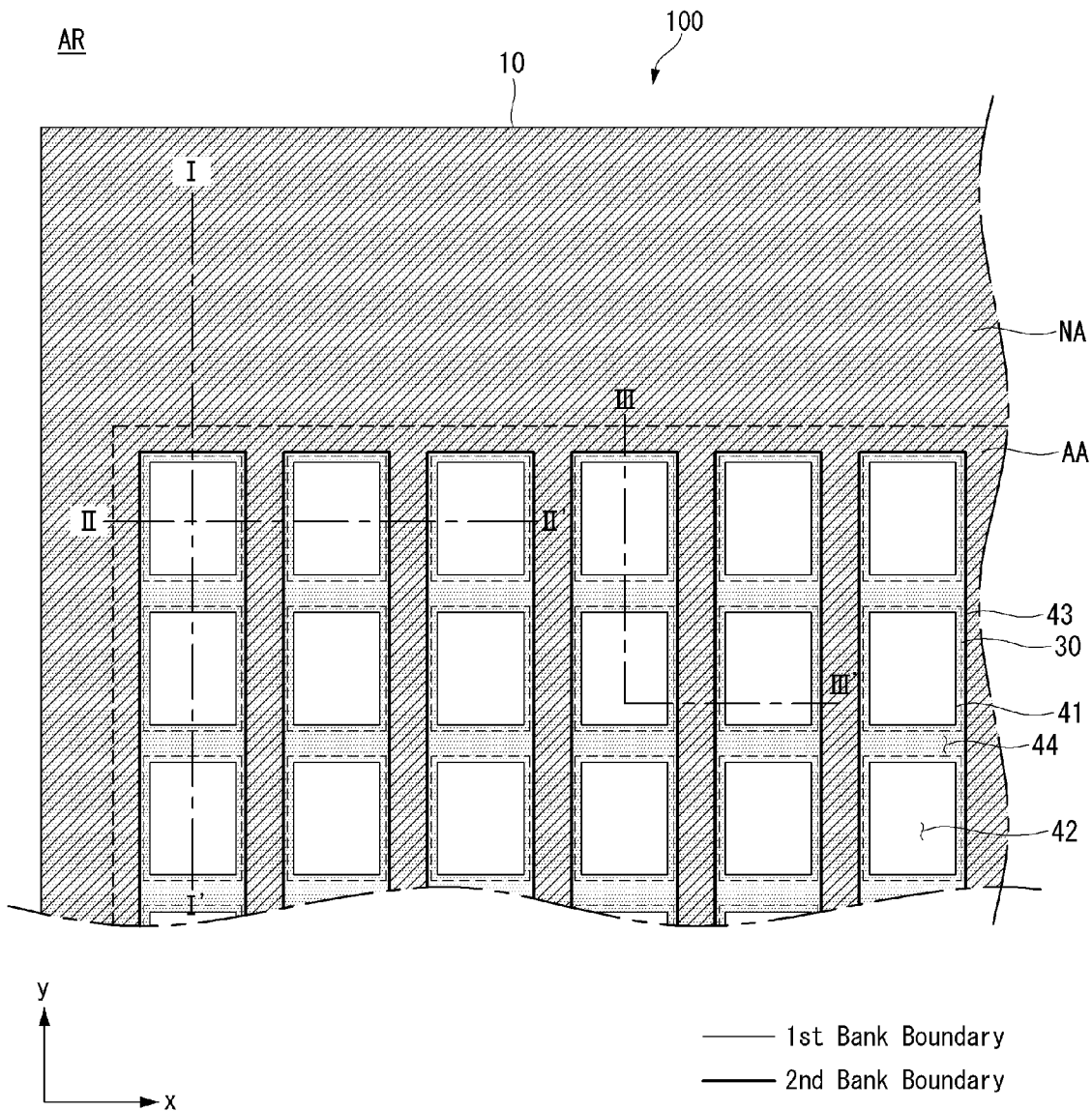
FIG. 4 is an enlarged plan view of an area AR of FIG. 1 schematically illustrating an organic light emitting display device according to a first embodiment of the present disclosure.
Figure 5A:
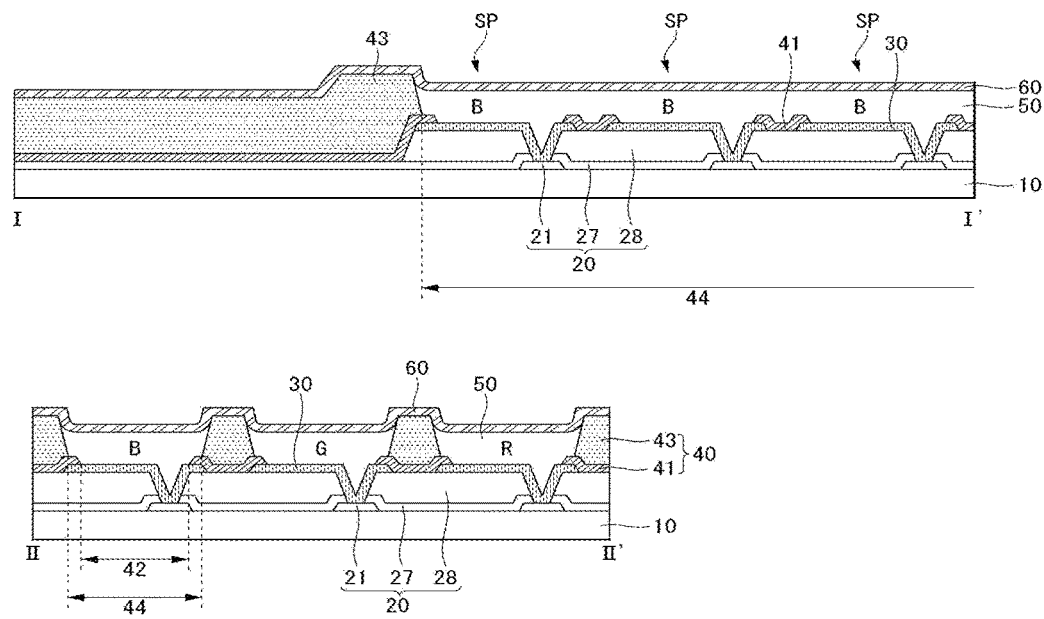
FIGS. 5A and 5B cross-sectional views taken along lines I-I' and II-II' of FIG. 4, respectively according to the first embodiment of the present disclosure.
Figure 5B:
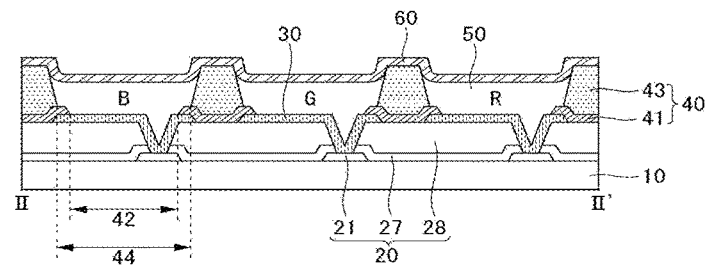

FIG. 4 is an enlarged plan view of an area AR of FIG. 1 schematically illustrating an organic light emitting display device according to a first embodiment of the present disclosure. FIGS. 5A and 5B are cross-sectional views taken along lines I-I' and II-II' of FIG. 4, respectively.

Referring to FIGS. 4 and 5A to 5B, an organic light emitting display device 100 according to the first embodiment of the present disclosure includes a substrate 10 having a display area AA in which sub-pixels SP are arranged and a non-display area NA outside the display area AA. The substrate 10 may have various planar shapes. For example, as shown in the drawings, the substrate may include all planar shapes such as a square shape, a circular shape, and an elliptical shape, as well as a rectangular shape. A first direction (e.g., X-axis direction) and a second direction (e.g., Y-axis direction) that intersect each other regardless of the planar shape of the substrate 10 are defined in the substrate 10. The position and arrangement relation of the sub-pixels and/or the openings may be defined by the first direction and the second direction.

A circuit element layer 20 and an OLED driven by elements provided in the circuit element layer 20 are disposed on the substrate 10.

A signal line and electrodes for applying a driving signal to the OLED may be arranged in the circuit element layer 20, and the signal line and the electrodes may be spaced apart and disposed with at least one insulating layer interposed therebetween as necessary. When the organic light emitting display device is implemented in an active matrix (AM) manner, the circuit element layer 20 may further include a thin-film transistor 21 allocated to each sub-pixel SP. In the following, for convenience of description, a case in which the thin-film transistor 21 is allocated to each sub-pixel will be described as an example. In this case, a passivation film 27 and an overcoat layer 28 are interposed between the thin-film transistor 21 and the OLED. The passivation film 27 includes an inorganic material and protects internal elements. The overcoat layer 28 includes a predetermined organic material and is formed to have a predetermined thickness, and compensates for a step difference due to the thin-film transistor 21 and the signal lines formed there below.

The OLED includes a first electrode 30, a second electrode 60, and an organic light emitting layer 50 interposed between the first electrode 30 and the second electrode 60. The first electrode 30 may be an anode, and the second electrode 60 may be a cathode.

More specifically, the sub-pixels SP may be arranged in the first direction and the second direction which intersect each other. The sub-pixels SP adjacently arranged in the first direction may emit light of different colors, and the sub-pixels SP adjacently arranged in the second direction may emit light of the same color. The first electrode 30 of the OLED is disposed in the sub-pixels SP. One first electrode 30 may be assigned per sub-pixel SP.

A bank 40 is disposed on the first electrode 30. The bank 40 includes a first bank 41 and a second bank 43.

The first bank 41 is positioned on the first electrode 30. The first bank 41 includes first openings 42 exposing at least some of the first electrode 30. One first opening 42 exposes one first electrode 30. Thus, the number of first openings 42 and the number of first electrodes 30 may correspond to each other.

The first bank 41 may be formed to a relatively small thickness so that the first bank is covered by the organic light emitting layer 50. The first bank 41 may have a hydrophilic property. As an example, the first bank 41 may be made of a hydrophilic inorganic insulating material, such as silicon oxide ($SiO_2$) and silicon nitride ($SiN_x$).

In FIG. 4, the first opening 42 is illustrated as having an approximately rectangular shape, but the present disclosure is not limited thereto. Further, all the first openings 42 are illustrated as having the same shape and area, but the present disclosure is not limited thereto. At least any one first opening 42 may have a shape and/or area different from that of another first opening 42. For example, the shape and/or area of the first opening 42 may be appropriately selected in consideration of the lifespan of an organic light emitting material for forming the organic light emitting layer 50 of the OLED. The portion of the first electrode 30 exposed by the first opening 42 may be defined as an emission area.

The second bank 43 is positioned on the substrate 10 on which the first bank 41 is formed. The second bank 43 includes second openings 44 exposing at least some of the first electrode 30. A plurality of the second openings 44 are arranged side by side in the first direction and extended in the second direction. The second openings 44 are extended in the second direction, and expose a plurality of first electrodes 30 disposed in the second direction. Alternatively, the second openings 44 are extended in the second direction, and expose a plurality of first openings 42 disposed in the second direction.

The second bank 43 may have a hydrophobic property. Alternatively, an upper surface and a side surface of the second bank 43 may have a hydrophobic property. As an example, the second bank 43 may have a form in which an insulating material is coated with a hydrophobic material, and may be made of an insulating material containing a hydrophobic material. The second bank 43 may be made of an organic material. The hydrophobic property of the second bank 43 may function to push an organic light emitting material constituting the organic light emitting layer 50 so that the organic light emitting material gathers at a central portion of the emission area. In addition, the second bank 43 may function as a barrier for confining an organic light emitting material dropped on a corresponding area in order to prevent organic light emitting materials of different colors from being mixed.

In FIG. 4, the second opening 44 is illustrated as having an approximately rectangular shape, but the present disclosure is not limited thereto. Further, all the second openings 44 are illustrated as having the same shape and area, but the present disclosure is not limited thereto. At least any one second opening 44 may have a shape and/or area different from that of another second opening 44. For example, the shape and/or area of the second opening 44 may be properly selected by taking into consideration the lifespan of an organic light emitting material.

The second opening 44 is positioned to be outwardly spaced apart from the first opening 42. That is, the boundary of the first bank 41 is spaced apart from the boundary of the second bank 43 by a predetermined interval. Thus, the first opening 42 may be exposed by the second opening 44.

The organic light emitting layer 50 is positioned on the substrate 10 on which the second bank 43 is formed. The organic light emitting layer 50 may be formed within the corresponding second opening 44 in the direction in which the second opening 44 is extended. That is, an organic light emitting material dropped into one second opening 44 covers the first electrodes 30 and the first banks 41 exposed by the second opening 44, and is not physically separated by the first banks 41.

An organic light emitting material of the same color is dropped on the plurality of first electrodes 30 exposed by one second opening 44. This means that light of the same color is emitted from a plurality of sub-pixels SP allocated to a position corresponding to one second opening 44. The planar shape of the organic light emitting layer 50 may correspond to the planar shape of the second opening 44.

Organic light emitting materials of different colors may be sequentially and alternately dropped into the corresponding second openings 44. The organic light emitting materials of different colors may include organic light emitting materials which emit red (R), green (G), and blue (B), and as necessary, may further include an organic light emitting material which emits white (W).

The second bank 43 is positioned between the first electrodes 30 adjacent to each other in the first direction and prevents differently colored organic light emitting materials dropped into the second openings 44 adjacent to each other in the first direction from being mixed. That is, differently colored organic light emitting materials dropped into different second openings 44 are physically separated by the second bank 43.

The organic light emitting material used to form the organic light emitting layer 50 in a solution process is dropped to cover at least some of the first electrode 30, some of the first bank 41, and some of the second bank 43. The first bank 41 is a hydrophilic thin film provided to reduce poor wettability of the first electrodes 30 due to a hydrophobic property thereof and allows hydrophilic organic light emitting materials to spread well. The second bank 43 is a hydrophobic thick film and pushes the hydrophilic organic light emitting material to the center. Due to the combined structure of the first bank 41 and the second bank 43, the organic light emitting layer 50 may be formed with a relatively uniform thickness in the emission area.

Further, in a case in which the second openings 44 each expose one first electrode 30, the thickness of the organic light emitting material dropped into each of the second openings 44 may be different depending on a variance in equipment of the solution process. The variance in the equipment may refer to varying spray rates between nozzles of inkjet equipment. That is, the spray rates of nozzles used to drop organic light emitting material into the second openings 44 may be inconsistent. In this case, the thickness of the organic light emitting material dropped into each of the sub-pixels SP through the nozzles allocated for one sub-pixel SP may vary according to a position.

In the organic light emitting display device 100 according to the first embodiment of the present disclosure, a plurality of sub-pixels SP may be allocated within one second opening 44, and a plurality of nozzles corresponding to the number of sub-pixels SP may be allocated within the one second opening 44, which compensates for the varying spray rates between the nozzles, so that the organic light emitting materials dropped into the second openings 44 may have a uniform thickness.

Accordingly, the organic light emitting display device according to the first embodiment of the present disclosure may reduce deterioration in the uniformity of the organic light emitting layer 50, thereby reducing deterioration of display quality due to the thickness deviation of the organic light emitting layer 50 in the sub-pixels SP. In addition, deterioration in the element's lifespan or imperfections like dark spot formations may be prevented or reduced by securing the uniformity of the organic light emitting layer 50.

The above-described predetermined distance between the boundary of the first bank 41 and the boundary of the second bank 43 refers to a minimum distance at which thickness uniformity of the organic light emitting layer 50 is secured. When the distance between the boundary of the first bank 41 and the boundary of the second bank 43 is less than the predetermined distance, the uniformity of the organic light emitting layer 50 may not be secured. When the distance between the boundary of the first bank 41 and the boundary of the second bank 43 is greater than the predetermined distance, the area of the first electrodes 30 which are covered by the first bank 41 increases, which may cause problems such as a small aperture ratio.

In the organic light emitting display device 100 according to the first embodiment of the present disclosure, the second openings 44 of the second bank 43 are extended in the second direction, so that the second bank 43 is not positioned between the sub-pixels SP adjacent to each other in the second direction.

Accordingly, in the organic light emitting display device 100 according to the first embodiment of the present disclosure, the above-described position constraints on the first bank 41 are relatively low, thereby improving the degree of design freedom and providing a wide emission area on the first electrodes 30. Thus, the present disclosure may enable more flexibility in terms of design freedom while ensuring a sufficiently large aperture ratio.

Further, in a high-resolution display device, the area of the sub-pixels SP is relatively reduced. In this case, the organic light emitting material, which is not dropped at its proper position, may cause a color mixing defect in which the organic light emitting layers 50 of different colors are mixed. The organic light emitting display device 100 according to the first embodiment of the present disclosure has the advantage of improving such a color mixing defect, because a sufficiently large area, on which the organic light emitting material is dropped, is secured in the second openings 44 corresponding to the sub-pixels SP.

Figure 6:
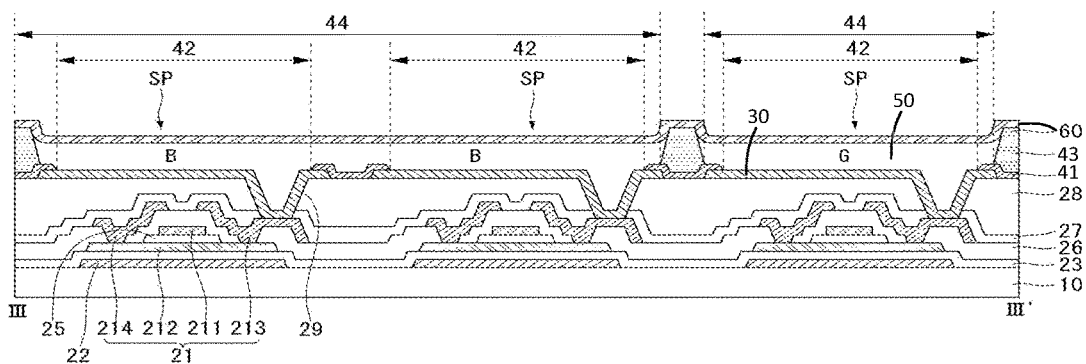
FIG. 6 is a cross-sectional view taken along line of FIG. 4 according to the first embodiment of the present disclosure.

FIG. 6 is a cross-sectional view taken along line of FIG. 4 according to one embodiment.

Referring to FIG. 6, the circuit element layer and the OLED disposed on the circuit element layer are disposed on the substrate 10. The circuit element layer may include the thin-film transistor 21 electrically connected to the OLED. As an example, a light-blocking layer 22 is positioned on the substrate 10. The light-blocking layer 22 functions to reduce the generation of a photocurrent in the transistor by blocking the incidence of external light. A buffer layer 23 is positioned on the light-blocking layer 22. The buffer layer 23 functions to protect the transistor, formed in a subsequent process, against impurities, such as alkali ions discharged from the light-blocking layer 22. The buffer layer 23 may be a silicon oxide ($SiO_x$) layer, a silicon nitride ($SiN_x$) layer, or a multilayer thereof.

A semiconductor layer 212 of the thin-film transistor 21 is positioned on the buffer layer 23. The semiconductor layer 212 may be made of a silicon semiconductor or an oxide semiconductor. The silicon semiconductor may include amorphous silicon or crystallized polysilicon silicon. The semiconductor layer 212 includes a drain area and a source area including p or n type impurities, and includes a channel between the drain area and the source area.

A gate insulating film 25 is positioned on the semiconductor layer 212. The gate insulating film 25 may be a silicon oxide ($SiO_x$) film, a silicon nitride ($SiN_x$) film, or a multi-layer thereof. A gate electrode 211 is positioned in a predetermined area of the semiconductor layer 212 on the gate insulating film 25, that is, a position corresponding to a channel. The gate electrode 211 is made of one selected from a group comprising of molybdenum (Mo), aluminum (Al), chromium (Cr), gold (Au), titanium (Ti), nickel (Ni), neodymium (Nd) or copper (Cu), or an alloy thereof. Further, the gate electrode 211 may be a multi-layer formed of elements selected from a group comprising of molybdenum (Mo), aluminum (Al), chromium (Cr), gold (Au), titanium (Ti), nickel (Ni), neodymium (Nd) or copper (Cu), or alloys thereof. For example, the gate electrode 211 may be a double layer of molybdenum/aluminum-neodymium or molybdenum/aluminum.

An interlayer insulating film 26 for insulating the gate electrode 211 is positioned on the gate electrode 211. The interlayer insulating film 26 may be formed of a silicon oxide ($SiO_x$) film, a silicon nitride ($SiN_x$) film, or a multi-layer thereof. A source electrode 213 and a drain electrode 214 are positioned on the interlayer insulating film 26. The source electrode 213 and the drain electrode 214 may be formed as a single layer or multi-layer. When the source electrode 213 and the drain electrode 214 are formed as a single layer, the source electrode 213 and the drain electrode 214 may be made of one selected from a group comprising of molybdenum (Mo), aluminum (Al), chromium (Cr), gold (Au), titanium (Ti), nickel (Ni), neodymium (Nd) or copper (Cu), or an alloy thereof. Further, when the source electrode 213 and the drain electrode 214 are formed as a multi-layer, the source electrode 213 and the drain electrode 214 may be formed as a double layer of molybdenum/aluminum-neodymium or a triple-layer of titanium/aluminum/titanium, molybdenum/aluminum/molybdenum, or molybdenum/aluminum-neodymium/molybdenum.

Accordingly, the thin-film transistor 21 including the semiconductor layer 212, the gate electrode 211, the source electrode 213, and the drain electrode 214 is formed.

The passivation film 27 is positioned on the substrate 10 including the thin-film transistor 21. The passivation film 27 is an insulating film for protecting elements disposed there below and may be formed of a silicon oxide ($SiO_x$) film, a silicon nitride ($SiN_x$) film, or a multi-layer thereof. The overcoat layer 28 is positioned on the passivation film 27. The overcoat layer 28 may be a planarization film for planarizing an uneven surface of the structure disposed there below and is made of an organic material such as polyimide, a benzocyclobutene series resin, or an acrylate. A sub-pixel contact hole 29 passing through the passivation film 27 to expose the source electrode 213 is positioned in some region of the overcoat layer 28.

The OLED is formed on the overcoat layer 28. The OLED includes the first electrode 30 connected to the thin-film transistor, the second electrode 60 facing the first electrode 30, and the organic light emitting layer 50 interposed between the first electrode 30 and the second electrode 60. The first electrode 30 may be an anode and the second electrode 60 may be a cathode.

The first electrode 30 may be positioned on the overcoat layer 28 and connected to the source electrode 213 of the transistor through the sub-pixel contact hole 29 passing through the overcoat layer 28. One first electrode 30 may be allocated per sub-pixel, but the present disclosure is not limited thereto. The first electrode 30 may be formed of a transparent conductive material such as indium tin oxide (ITO), indium zinc oxide (IZO) or zinc oxide (ZnO) to function as a transparent electrode or may include a reflective layer to function as a reflective electrode in response to an adopted emission method. The reflective layer may be made of aluminum (Al), copper (Cu), silver (Ag), nickel (Ni), or an alloy thereof, and in one embodiment, may be made of APC (silver/palladium/copper alloy).

The bank 40 is disposed on the substrate 10 on which the first electrode 30 is formed. The bank 40 includes the first bank 41 and the second bank 43. The first bank 41 and the second bank 43 include openings that expose most of the first electrodes 30.

The organic light emitting layer 50 is disposed on the substrate 10 on which the bank 40 is formed. The organic light emitting layer 50 includes a light emitting layer (EML) and may further include one or more of common layers such as a hole injection layer (HIL), a hole transport layer (HTL), an electron transport layer (ETL), and an electron injection layer (EIL). The bank 40 includes a first bank 41 and a second bank 43.

The first bank 41 includes first openings 42 that expose a plurality of first electrodes 30 arranged in a row direction. The second bank 43 includes second openings 44 that expose a plurality of first electrodes 30 arranged in a column direction.

The second electrode 60 is disposed on the organic light emitting layer 50. The second electrode 60 may be widely formed over the entire surface of the substrate 10. The second electrode 60 may function as a transparent electrode or a reflective electrode in response to an adopted emission method. When the second electrode 60 is a transparent electrode, the second electrode 60 may be made of a transparent conductive material such as ITO or IZO or formed using a thin film of magnesium (Mg), calcium (Ca), aluminum (Al), silver (Ag), or an alloy thereof, which may allow light to pass therethrough.

Figure 7A:
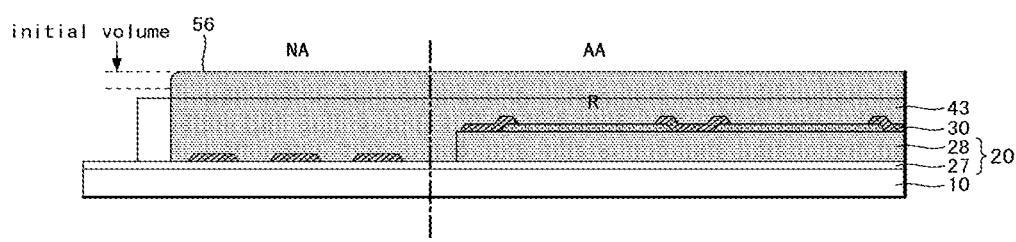
FIGS. 7A to 7C are views for describing a dewetting phenomenon at an edge portion according to one embodiment of the present disclosure.
Figure 7B:
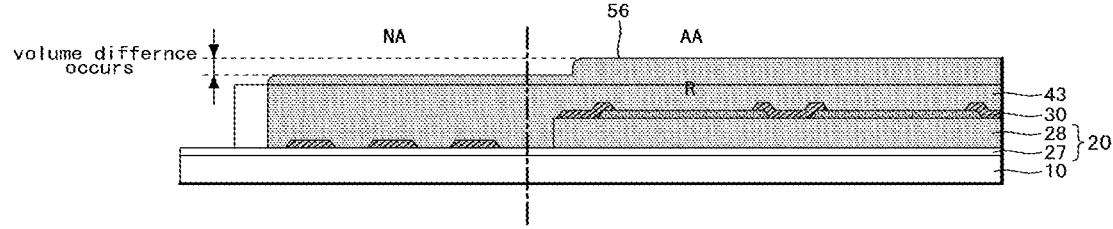
Figure 7C:
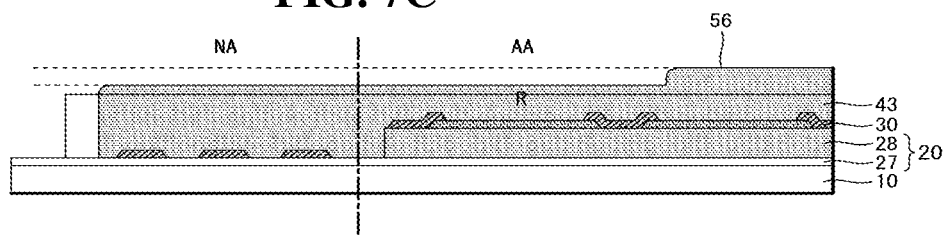

FIGS. 7A to 7C are views for describing a dewetting phenomenon at an edge portion.

Referring to FIGS. 7A to 7C, when an organic light emitting material 56 is dropped on the substrate 10, the organic light emitting material 56 is dropped into the second opening 44 of the second bank 43 divided into the display area AA and the non-display area NA. At the beginning of dropping, the organic light emitting material 56 is formed in the display area AA and the non-display area NA with a uniform thickness.

In the process of drying the organic light emitting material 56, the non-display area NA around the display area AA of the substrate 10 has a lower vapor pressure than the center of the display area AA, so that natural drying proceeds faster in the non-display area NA compared to the display area AA. In this case, the thickness of the organic light emitting material 56 increases toward the center of the display area AA due to the cohesive force of the liquid and the convection phenomenon of ambient vapor pressure.

In other words, while the organic light emitting material 56 is drying, a phenomenon occurs in which the organic light emitting material 56 is rapidly dried at an outer periphery of the display area AA and aggregates at a central portion of the display area. Accordingly, the dewetting phenomenon at the edge portion may occur in which the amount of the organic light emitting material 56 decreases in the non-display area NA outside the display area AA.

Figure 8:
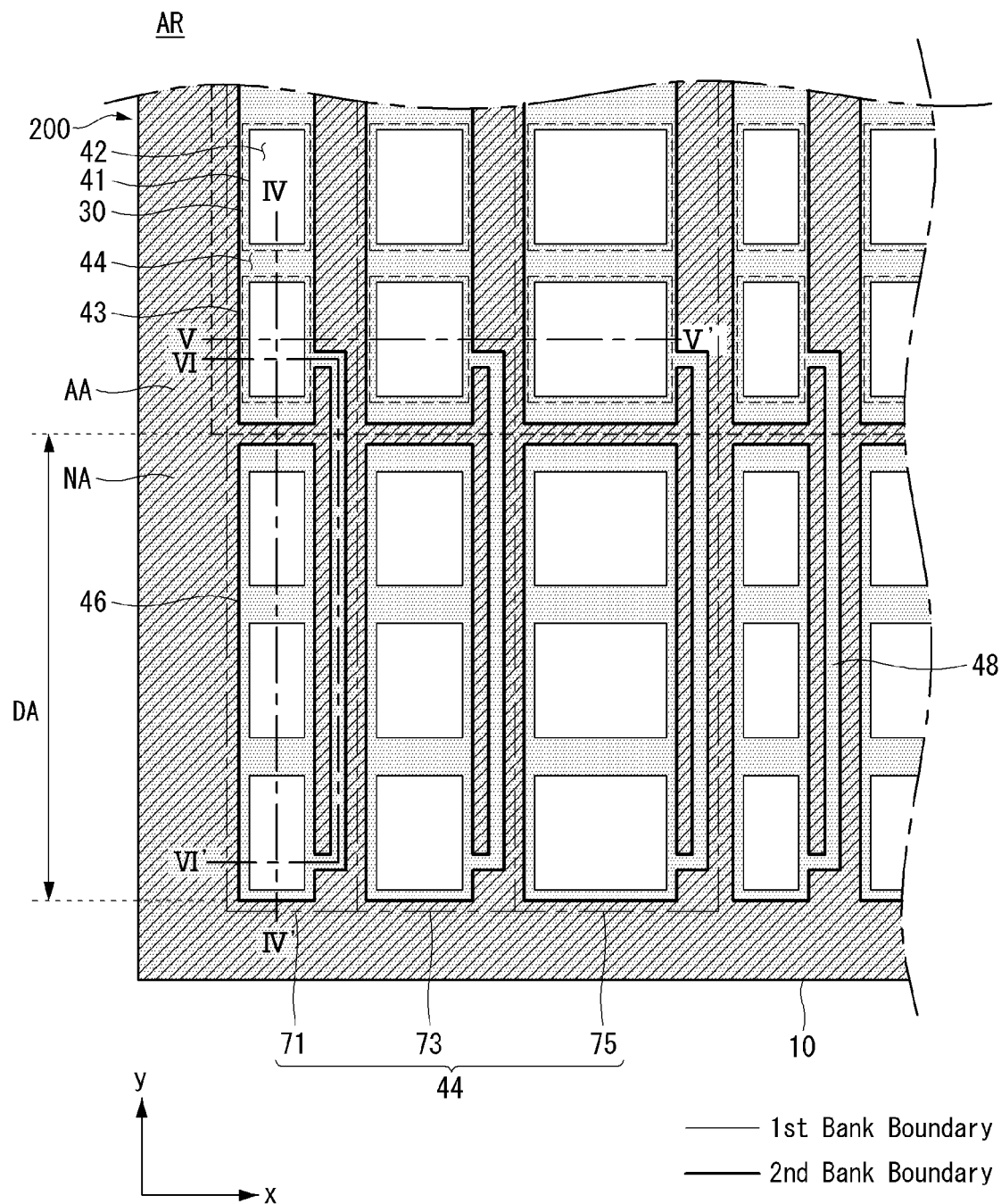
FIG. 8 is an enlarged plan view schematically of an area AR of FIG. 1 illustrating an organic light emitting display device according to a second embodiment of the present disclosure.
Figure 9A:
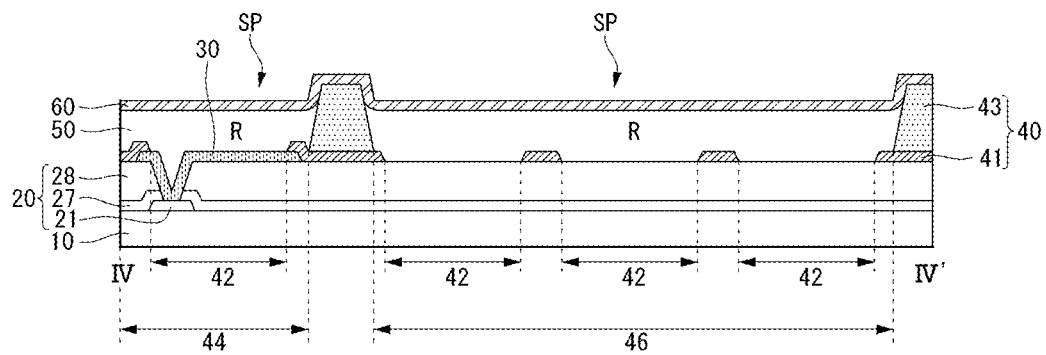
FIGS. 9A to 9C are cross-sectional views taken along line IV-IV', V-V', and VI-VI' of FIG. 8, respectively according to the second embodiment of the present disclosure.
Figure 9B:
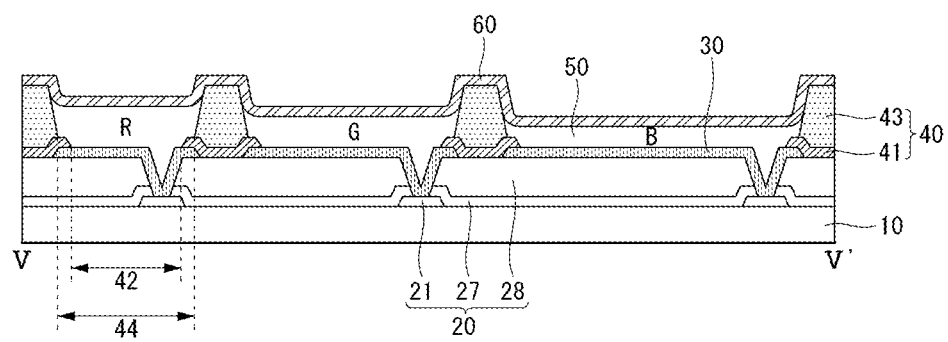
Figure 9C:
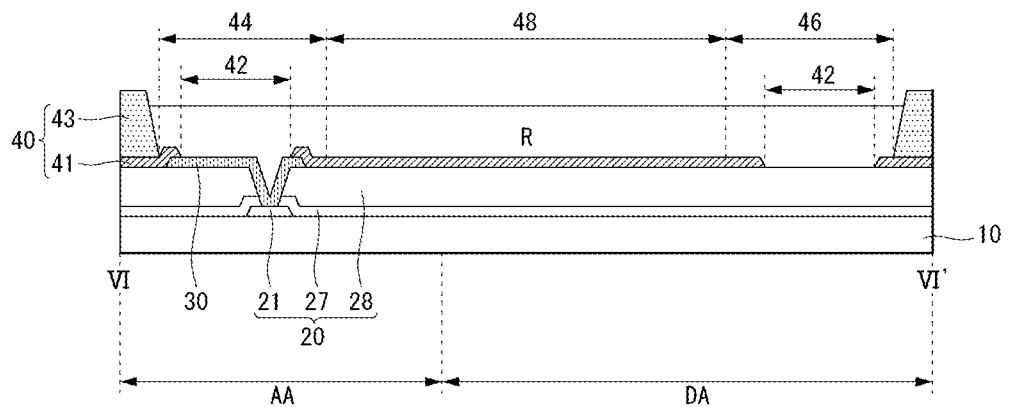
Figure 10:
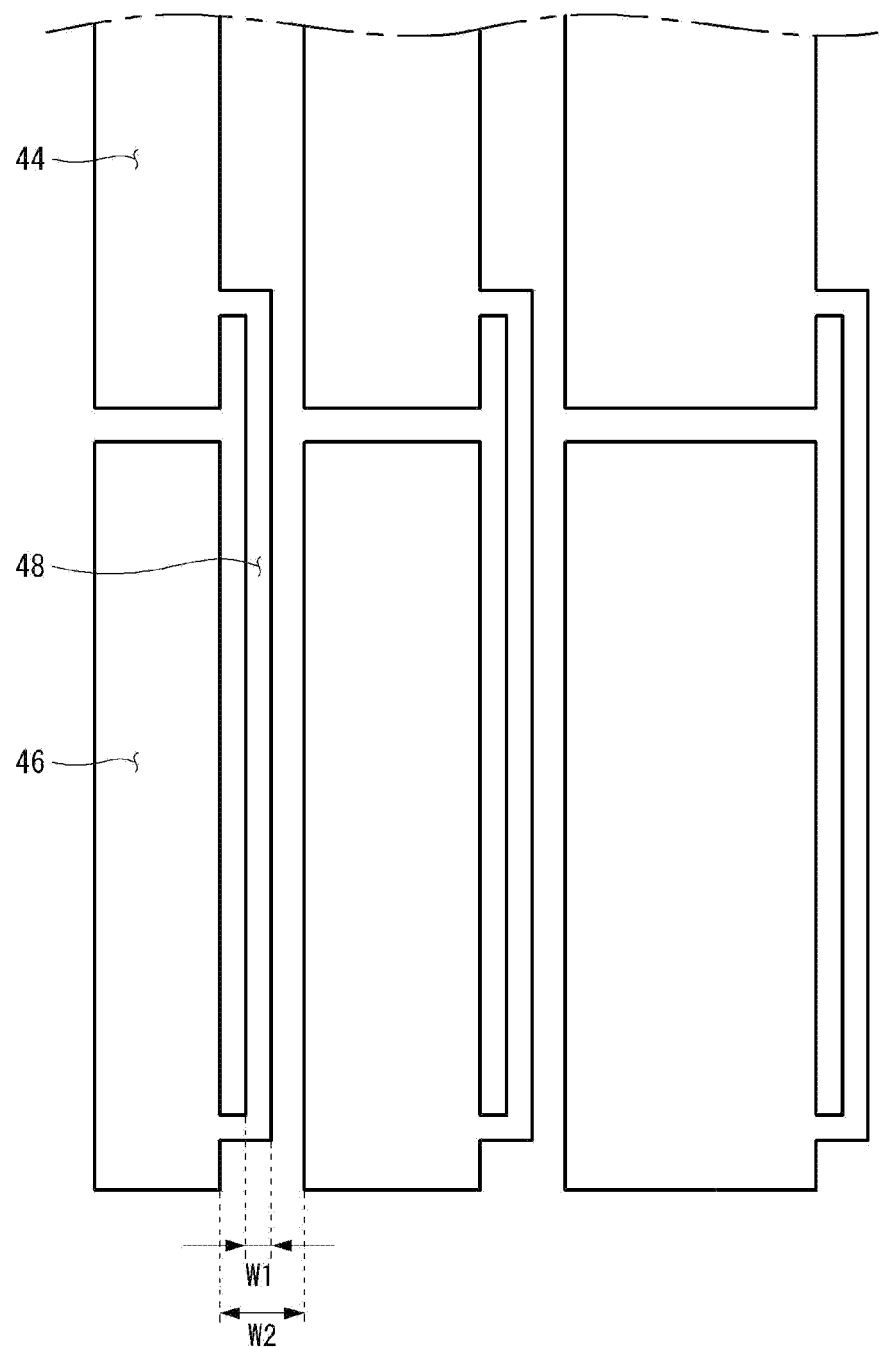
FIG. 10 is a plan view illustrating second openings, third openings, and fourth openings of the organic light emitting display device according to the second embodiment of the present disclosure.

Accordingly, a defect may occur in which the thickness of the organic light emitting layer formed after drying is not uniform according to position, that is, the thickness of a central portion of the organic light emitting layer, at which the organic light emitting material aggregates, is increased, and the thickness of a peripheral portion thereof is decreased due to the phenomenon in which the organic light emitting material 56 aggregates at the central portion of the display area AA of the second opening 44. This appears to a user as a luminance difference between the peripheral portion and the central portion, leading to display quality deterioration Second Embodiment FIG. 8 is an enlarged plan view of the area AR of FIG. 1 schematically illustrating an organic light emitting display device according to a second embodiment of the present disclosure. FIGS. 9A to 9C are cross-sectional views taken along line IV-IV', V-V', and VI-VI' of FIG. 8, respectively. FIG. 10 is a plan view illustrating second openings, third openings, and fourth openings of the organic light emitting display device according to the second embodiment of the present disclosure.

Referring to FIGS. 8 and 9A to 9C, an organic light emitting display device 200 according to the second embodiment of the present disclosure includes a substrate 10 having a display area AA in which sub-pixels SP are arranged and a non-display area NA outside the display area AA. The substrate 10 may have various planar shapes. For example, as shown in the drawings, the substrate may include all planar shapes such as a square shape, a circular shape, and an elliptical shape, as well as a rectangular shape. A first direction (e.g., X-axis direction) and a second direction (e.g., Y-axis direction) that intersect each other regardless of the planar shape of the substrate 10 are defined in the substrate 10. The position and arrangement relation of the sub-pixels and/or the openings may be defined by the first direction and the second direction.

A circuit element layer 20 and an OLED driven by elements provided in the circuit element layer 20 are disposed on the substrate 10.

A signal line and electrodes for applying a driving signal to the OLED may be arranged in the circuit element layer 20, and the signal line and the electrodes may be spaced apart and disposed with at least one insulating layer interposed therebetween as necessary. When the organic light emitting display device is implemented in an AM manner, the circuit element layer 20 may further include a thin-film transistor 21 allocated to each sub-pixel SP. In the following, for convenience of description, a case in which the thin-film transistor 21 is allocated to each sub-pixel will be described as an example. In this case, a passivation film 27 and an overcoat layer 28 are interposed between the thin-film transistor 21 and the OLED. The passivation film 27 includes an inorganic material and protects internal elements. The overcoat layer 28 includes a predetermined organic material and is formed to have a predetermined thickness, and compensates for a step difference due to the thin-film transistor 21 and the signal lines formed there below.

As shown in FIG. 9A, an overcoat layer 28 may be disposed in the display area AA and the non-display area NA. That is, the overcoat layer 28 may be continuously disposed over the display area AA and the non-display area NA.

The OLED includes a first electrode 30, a second electrode 60, and an organic light emitting layer 50 interposed between the first electrode 30 and the second electrode 60. The first electrode 30 may be an anode, and the second electrode 60 may be a cathode.

Specifically, sub-pixels SP may be arranged in the first direction and the second direction which intersect each other. The sub-pixels SP adjacently arranged in the first direction may emit light of different colors, and the sub-pixels SP adjacently arranged in the second direction may emit light of the same color. The first electrode 30 of the OLED is disposed in the sub-pixels SP. One first electrode 30 may be assigned per sub-pixel SP.

A bank 40 is disposed on the first electrode 30. The bank 40 includes a first bank 41 and a second bank 43.

The first bank 41 is positioned on the first electrode 30. The first bank 41 includes first openings 42 exposing at least some of the first electrode 30. One first opening 42 exposes one first electrode 30. Thus, the number of first openings 42 and the number of first electrodes 30 may correspond to each other.

The first bank 41 may be formed to a relatively small thickness so that the first bank is covered by the organic light emitting layer 50. The first bank 41 may have a hydrophilic property. As an example, the first bank 41 may be made of a hydrophilic inorganic insulating material, such as silicon oxide ($SiO_2$) and silicon nitride ($SiN_x$).

The first bank 41 is formed over the entirety of the display area AA and the non-display area NA. The first opening 42 of the first bank 41 is formed in the display area AA and the non-display area NA. The first opening 42 exposes the first electrode 30 in the display area AA, and exposes the overcoat layer 28 below the first electrode 30 in the non-display area NA.

In the drawing, the first opening 42 is illustrated as having an approximately rectangular shape, but the present disclosure is not limited thereto. Further, all the first openings 42 are illustrated as having the same shape and area, but the present disclosure is not limited thereto. At least any one first opening 42 may have a shape and/or area different from that of another first opening 42. For example, the shape and/or area of the first opening 42 may be appropriately selected in consideration of the lifespan of an organic light emitting material for forming the organic light emitting layer 50 of the OLED. The portion of the first electrode 30 exposed by the first opening 42 may be defined as an emission area.

The non-display area NA may further include a dummy area DA. The dummy area DA is an area adjacent to the display area AA in the second direction. The first bank 41 is disposed in the display area AA, and is extended up to the dummy area DA of the non-display area NA. In the dummy area DA, the overcoat layer 28 is interposed between the first bank 41 and the substrate 10.

The second bank 43 is positioned on the substrate 10 on which the first bank 41 is formed. The second bank 43 includes second openings 44 exposing at least some of the first electrode 30. A plurality of the second openings 44 are arranged side by side in the first direction and extended in the second direction. The second openings 44 are extended in the second direction, and expose a plurality of first electrodes 30 disposed in the second direction. Alternatively, the second openings 44 are extended in the second direction, and expose a plurality of first openings 42 disposed in the second direction.

The second bank 43 may have a hydrophobic property. As an example, the second bank 43 may have a form in which an insulating material is coated with a hydrophobic material, and may be made of an insulating material containing a hydrophobic material. The second bank 43 may be made of an organic material. The hydrophobic property of the second bank 43 may function to push an organic light emitting material constituting the organic light emitting layer 50 so that the organic light emitting material does not gather at a central portion of the emission area. In addition, the second bank 43 may function as a barrier for confining an organic light emitting material dropped on a corresponding area in order to prevent organic light emitting materials of different colors from being mixed.

In FIG. 8, the second opening 44 is illustrated as having an approximately rectangular shape, but the present disclosure is not limited thereto. Further, all the second openings 44 are illustrated as having the same shape and area, but the present disclosure is not limited thereto. At least any one second opening 44 may have a shape and/or area different from that of another second opening 44. For example, the shape and/or area of the second opening 44 may be properly selected by taking into consideration the lifespan of an organic light emitting material.

The second opening 44 is positioned to be outwardly spaced apart from the first opening 42. That is, the boundary of the first bank 41 is spaced apart from the boundary of the second bank 43 by a predetermined interval. Thus, the first opening 42 may be exposed by the second opening 44. The second bank 43 is disposed in the display area AA, and the second openings 44 expose the plurality of first electrodes 30 arranged in the display area AA.

The second bank 43 includes third openings 46 disposed in the non-display area NA. The third opening 46 is formed in the dummy area DA of the non-display area NA, and exposes the first bank 41 disposed in the dummy area DA. The dummy area DA is a non-display area NA in which the thin-film transistors and the OLED are not disposed. Accordingly, the third opening 46 exposes the first bank 41 and the overcoat layer 28 exposed by the first opening 42 of the first bank 41 in the dummy area DA. The third opening 46 is extended and disposed in the second direction identical to a direction in which the second opening 44 is extended. The third opening 46 is separated from the second opening 44 by the second bank 43 and disposed to be spaced apart therefrom.

Meanwhile, the second bank 43 includes fourth openings 48 connecting the second openings 44 and the third openings 46. The fourth opening 48 is branched from the second opening 44 and connected to the third opening 46 that is formed to be collinear with the second opening 44. For example, the fourth opening 48 is branched from each of the second opening 44 and the third opening 46, and extended to connect the second opening 44 and the third opening 46. The fourth opening 48 is branched from each of the second opening 44 and the third opening 46, and disposed over the display area AA and the non-display area NA. The fourth opening 48 is disposed in the second bank 43 formed between the third openings 46 adjacent to each other.

The organic light emitting layer 50 is positioned on the substrate 10 on which the second bank 43 is formed. The organic light emitting layer 50 may be formed along and within the corresponding second opening 44, third opening 46, and fourth opening 48. That is, an organic light emitting material dropped into the second opening 44 covers the first electrodes 30 and the first banks 41 exposed by the second openings 44, and is not physically separated by the first bank 41. In addition, an organic light emitting material dropped into the third opening 46 covers the first bank 41 and the overcoat layer 28 exposed by the third opening 46, and is not physically separated by the first banks 41. In addition, an organic light emitting material dropped into the second opening 44 and the third opening 46 is spread along the fourth opening 48, which is connected to the second opening 44 and the third opening 46, and fills the fourth opening 48.

An organic light emitting material of the same color is dropped on the plurality of first electrodes 30 exposed by the second openings 44. This means that light of the same color is emitted from a plurality of sub-pixels SP allocated to a position corresponding to one second opening 44. In addition, an organic light emitting material of the same color is also dropped into the third opening 46 extending in the same direction as the second opening 44, and fills the fourth opening 48 connected to the second opening 44 and the third opening 46. The planar shape of the organic light emitting layer 50 may correspond to the planar shape of the second opening 44.

Organic light emitting materials of different colors may be sequentially and alternately dropped into the corresponding second opening 44, third opening 46, and fourth opening 48. The organic light emitting materials of different colors may include organic light emitting materials which emit red (R), green (G), and blue (B), and as necessary, may further include an organic light emitting material which emits white (W).

The second bank 43 is positioned between the first electrodes 30 adjacent to each other in the first direction and prevents differently colored organic light emitting materials dropped into the corresponding second opening 44, third opening 46, and fourth opening 48 adjacent to each other in the first direction from being mixed. That is, differently colored organic light emitting materials dropped into the corresponding second opening 44, third opening 46, and fourth opening 48 are physically separated by the second bank 43.

As described above, the organic light emitting display device 200 according to the second embodiment of the present disclosure may include the fourth opening 48 connecting the second opening 44 and the third opening 46.

Specifically, the second openings 44, the third openings 46, and the fourth openings 48 of the second bank 43 include a first column 71, a second column 73, and a third column 75 that include different organic light emitting layers 50. The first column 71 is an area in which the organic light emitting layer 50 displaying any same color is formed in the second opening 44, the third opening 46, and the fourth opening 48 that are arranged in the second direction. The second column 73 is an area which is spaced apart from the first column 71 by a small gap and in which the organic light emitting layer 50 displaying a color different from that of the organic light emitting layer 50 formed in the first column 71 is formed. The third column 75 is an area which is spaced apart from the second column 73 by a small gap and in which the organic light emitting layer 50 displaying a color different from those of the organic light emitting layers 50 formed in the first column 71 and the second column 73 is formed.

The second bank 43 includes the second opening 44, the third opening 46, and the fourth opening 48 connecting the second opening 44 and the third opening 46 in each of the first column 71, the second column 73, and the third column 75. For example, the fourth opening 48 is formed over the display area AA and the non-display area NA by connecting the second opening 44 formed in the display area AA and the third opening 46 formed in the non-display area NA. The fourth opening 48 is formed in a shape branching from each of the second opening 44 and the third opening 46 in the first direction and extending in the second direction. The fourth opening 48 in the first column 71 may have the same length (e.g., a vertical length) as each of the fourth opening 48 in the second column 73 and the fourth opening 48 in the third column 75. In addition, a width of the fourth opening 48 in the first column 71 may be equal to a width of each of the fourth opening 48 in the second column 73 and the fourth opening 48 in the third column 75.

The fourth opening 48 is formed to have a width smaller than that of each of the second opening 44 disposed in the display area AA and the third opening 46 disposed in the non-display area NA. Since the fourth opening 48 is formed to have a width smaller than those of the second opening 44 and the third opening 46, when the organic light emitting material is dropped and spread evenly in the second opening 44 and the third opening 46, a capillary phenomenon acts so that the organic light emitting material moves well through the fourth opening 48.

As described in the aforementioned first embodiment, when the organic light emitting material is dropped and then dried, the organic light emitting material is rapidly dried at the peripheral portion of the display area AA and aggregates at the central portion of the display area AA, so that the thickness of the organic light emitting layer is not uniformly formed.

The organic light emitting display device 200 according to the second embodiment of the present disclosure may include the dummy area DA in the non-display area NA other than the display area AA, and include the fourth opening 48 connecting the third opening 46 disposed in the dummy area DA to the second opening 44 disposed in the display area AA. The third opening 46 stores the dropped organic light emitting material. The organic light emitting material stored in the third opening 46 may be fill the second opening 44 due to the capillary phenomenon caused by the fourth opening 48 having a small width.

For example, when the organic light emitting material dropped into the second opening 44 disposed in an edge portion of the display area AA is rapidly dried, and the organic light emitting material aggregates at the central portion of the display area AA, the organic light emitting material, which is dropped into the third opening 46 disposed in the dummy area DA, fills the second opening 44 through the fourth opening 48. That is, since the organic light emitting material is continuously supplied to the second opening 44 disposed at the edge portion of the display area AA, the amount of the organic light emitting material of the second opening 44 disposed at the edge portion may be maintained to some extent. Accordingly, the organic light emitting layer formed after the organic light emitting material is dried may have a uniform thickness at the edge portion and the central portion of the display area AA, so that luminance non-uniformity may be prevented or reduced, thereby improving display quality.

Referring to FIG. 10, a width W1 of the fourth opening 48 may be formed to be less than the width of each of the second opening 44 and the third opening 46. In particular, the width W1 of the fourth opening 48 may be formed to be less than a width W2 of the second bank 43 formed between the adjacent third openings 46. For example, the width W1 of the fourth opening 48 may be formed to be 5% to 30% of the width W2 of the second bank 43 formed between the adjacent third openings 46. When the width W1 of the fourth opening 48 is greater than or equal to 5% of the width W2 of the second bank 43 formed between the adjacent third openings 46, the organic light emitting material in the third opening 46 may be smoothly moved through the fourth opening 48. When the width W1 of the fourth opening 48 is less than or equal to 30% of the width W2 of the second bank 43 formed between adjacent third openings 46, a situation in which the capillary phenomenon does not occur due to a large width W1 of the fourth opening 48.

Third Embodiment

Figure 11:
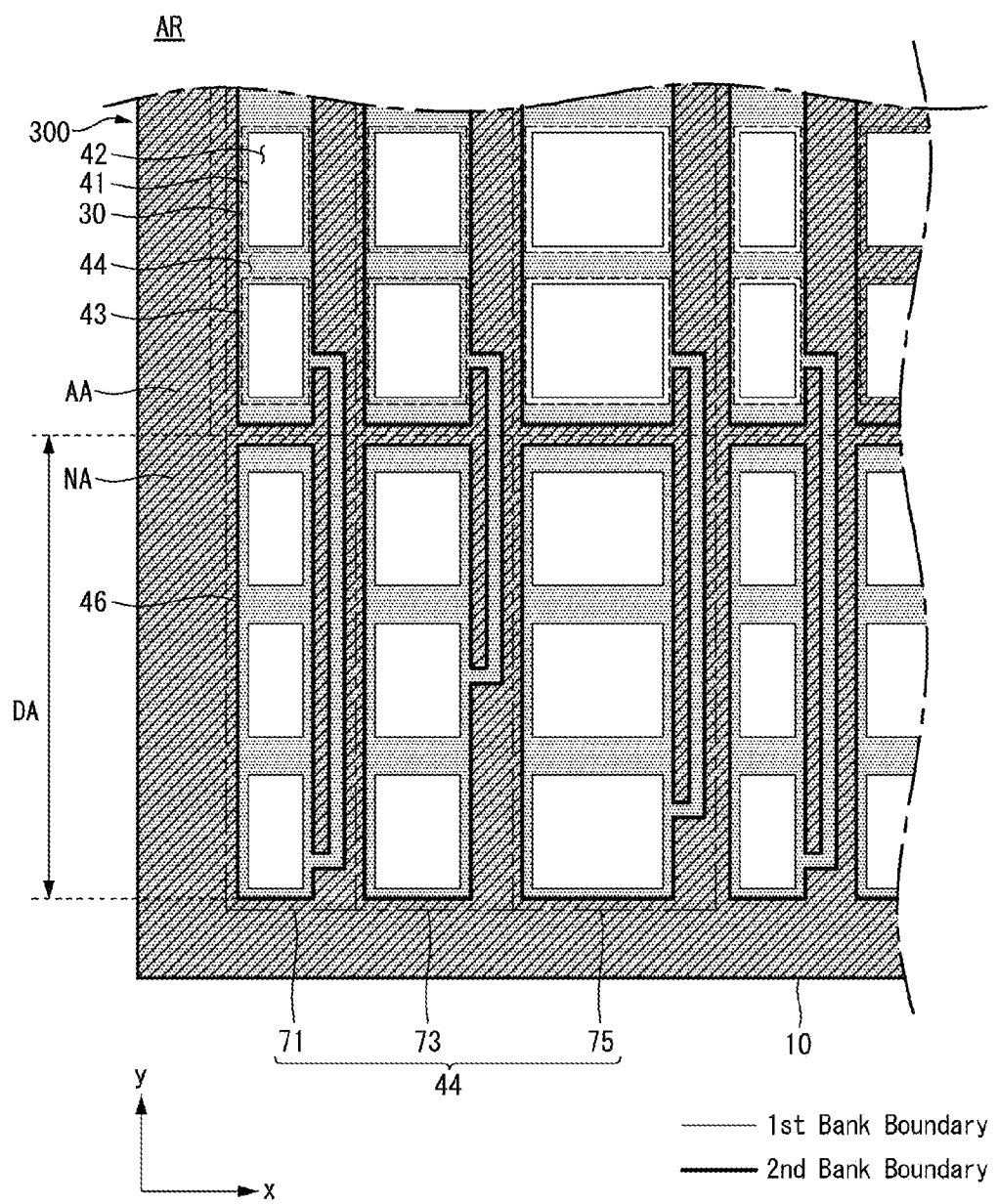
FIG. 11 is an enlarged plan view of the area AR of FIG. 1 schematically illustrating an organic light emitting display device according to a third embodiment of the present disclosure.
Figure 12:
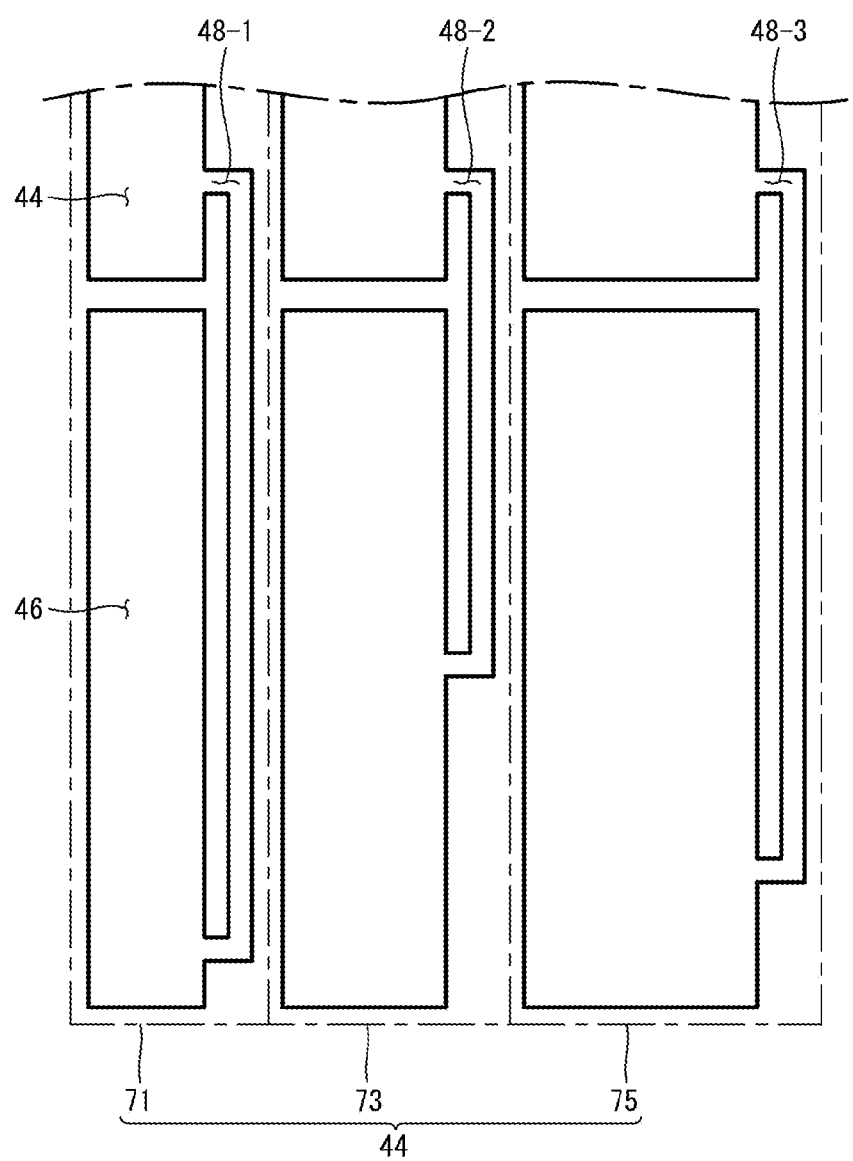
FIG. 12 is a plan view illustrating second openings, third openings, and fourth openings of the organic light emitting display device according to the third embodiment of the present disclosure.

FIG. 11 is an enlarged plan view of the area AR of FIG. 1 schematically illustrating an organic light emitting display device according to a third embodiment of the present disclosure. FIG. 12 is a plan view illustrating second openings, third openings, and fourth openings of the organic light emitting display device according to the third embodiment of the present disclosure.

Referring to FIG. 11, an organic light emitting display device 300 according to the third embodiment of the present disclosure includes a substrate 10 having a display area AA in which sub-pixels SP are arranged and a non-display area NA outside the display area AA. Although not shown in the drawings, a circuit layer 20 including a thin-film transistor 21, a passivation film 27, and an overcoat layer 28 may be provided on the substrate 10 similar to the second embodiment described above.

Specifically, the sub-pixels SP may be arranged in the first direction and the second direction which intersect each other. A first electrode 30 of an OLED is disposed in the sub-pixels SP. One first electrode 30 may be assigned per sub-pixel SP.

A bank 40 is disposed on the first electrode 30. The bank 40 includes a first bank 41 and a second bank 43.

The first bank 41 is positioned on the first electrode 30. The first bank 41 includes first openings 42 exposing at least some of the first electrode 30, and may have a hydrophilic property. The first bank 41 is formed over the entirety of the display area AA and the non-display area NA. The non-display area NA may further include a dummy area DA. The dummy area DA is an area adjacent to the display area AA in the second direction.

The second bank 43 is positioned on the substrate 10 on which the first bank 41 is formed. The second bank 43 includes second openings 44 exposing at least some of the first electrode 30. A plurality of the second openings 44 are arranged side by side in the first direction and extended in the second direction. The second openings 44 are extended in the second direction, and expose a plurality of first electrodes 30 disposed in the second direction. Alternatively, the second openings 44 are extended in the second direction, and expose a plurality of first openings 42 disposed in the second direction. The second bank 43 may have a hydrophobic property.

The second opening 44 is positioned to be outwardly spaced apart from the first opening 42. That is, the boundary of the first bank 41 is spaced apart from the boundary of the second bank 43 by a predetermined interval. Thus, the first opening 42 may be exposed by the second opening 44. The second bank 43 is disposed in the display area AA, and the second openings 44 expose the plurality of first electrodes 30 arranged in the display area AA.

The second bank 43 includes third openings 46 disposed in the non-display area NA. The third opening 46 is formed in the dummy area DA of the non-display area NA, and exposes the first bank 41 disposed in the dummy area DA. The third opening 46 is extended and disposed in the second direction identical to a direction in which the second opening 44 is extended. The third opening 46 is separated from the second opening 44 by the second bank 43 and disposed to be spaced apart therefrom.

The second bank 43 includes fourth openings 48 connecting the second openings 44 and the third openings 46. The fourth opening 48 is branched from the second opening 44 and connected to the third opening 46 that is formed to be collinear with the second opening 44. For example, the fourth opening 48 is branched from each of the second opening 44 and the third opening 46 and is extended to connect the second opening 44 and the third opening 46. The fourth opening 48 is branched from each of the second opening 44 and the third opening 46, and disposed over the display area AA and the non-display area NA. The fourth opening 48 is disposed in the second bank 43 formed between the adjacent third openings 46.

An organic light emitting material of the same color is dropped on the plurality of first electrodes 30 exposed by the second openings 44. This means that light of the same color is emitted from a plurality of sub-pixels SP allocated to a position corresponding to one second opening 44. In addition, an organic light emitting material of the same color is also dropped into the third opening 46 extending in the same direction as the second opening 44, and fills the fourth opening 48 connected to the second opening 44 and the third opening 46. The planar shape of the organic light emitting layer 50 may correspond to the planar shape of the second opening 44.

Organic light emitting materials of different colors may be sequentially and alternately dropped into the corresponding second opening 44, third opening 46, fourth opening 48. The organic light emitting materials of different colors may include organic light emitting materials which emit red (R), green (G), and blue (B), and as necessary, may further include an organic light emitting material which emits white (W).

The second bank 43 is positioned between the first electrodes 30 adjacent to each other in the first direction and prevents differently colored organic light emitting materials dropped into the corresponding second opening 44, third opening 46, and fourth opening 48 adjacent to each other in the first direction from being mixed. That is, differently colored organic light emitting materials dropped into the corresponding second opening 44, third opening 46, and fourth opening 48 are physically separated by the second bank 43.

As described above, the organic light emitting display device 300 according to the third embodiment of the present disclosure may include the fourth opening 48 connecting the second opening 44 and the third opening 46.

Specifically, the second openings 44, the third openings 46, and the fourth openings 48 of the second bank 43 include a first column 71, a second column 73, and a third column 75 that include different organic light emitting layers. The first column 71 is an area in which the organic light emitting layer displaying any one color is formed in the second opening 44, the third opening 46, and the fourth opening 48 that are arranged in the second direction. The second column 73 is an area which is spaced apart from the first column 71 by a small gap and in which the organic light emitting layer displaying a color different from that of the organic light emitting layer formed in the first column 71 is formed. The third column 75 is an area which is spaced apart from the second column 73 by a small gap and in which the organic light emitting layer displaying a color different from those of the organic light emitting layers formed in the first column 71 and the second column 73 is formed.

The second bank 43 includes the second opening 44, the third opening 46, and the fourth opening 48 connecting the second opening 44 and the third opening 46 in each of the first column 71, the second column 73, and the third column 75. For example, the fourth opening 48 is formed over the display area AA and the non-display area NA by connecting the second opening 44 formed in the display area AA and the third opening 46 formed in the non-display area NA. The fourth opening 48 is formed in a shape branching from each of the second opening 44 and the third opening 46 in the first direction and extending in the second direction.

The fourth opening 48 is formed to have a width smaller than that of each of the second opening 44 disposed in the display area AA and the third opening 46 disposed in the non-display area NA. Since the fourth opening 48 is formed to have a width smaller than those of the second opening 44 and the third opening 46, when the organic light emitting material is dropped and spread evenly in the second opening 44 and the third opening 46, a capillary phenomenon acts so that the organic light emitting material moves well through the fourth opening 48.

The organic light emitting display device 300 according to the third embodiment of the present disclosure may include the dummy area DA in the non-display area NA other than the display area AA, and include the fourth opening 48 connecting the third opening 46 disposed in the dummy area DA to the second opening 44 disposed in the display area AA. When the organic light emitting material dropped into the second opening 44 disposed in the edge portion of the display area AA is rapidly dried, and the organic light emitting material aggregates at a central portion of the display area AA, the organic light emitting material, which is dropped into the third opening 46 disposed in the dummy area DA, fills the second opening 44 through the fourth opening 48. That is, since the organic light emitting material is continuously supplied to the second opening 44 disposed in the edge portion of the display area AA, the amount of the organic light emitting material of the second opening 44 disposed at the edge portion may be maintained to some extent. Accordingly, the organic light emitting layer formed after the organic light emitting material is dried may have a uniform thickness at the edge portion and the central portion of the display area AA, so that luminance non-uniformity may be prevented or reduced, thereby improving display quality.

As shown in FIG. 12, in the organic light emitting display device 300 according to the third embodiment of the present disclosure, a fourth-first opening 48-1 is disposed in a first column 71, a fourth-second opening 48-2 is disposed in a second column 73, and a fourth-third opening 48-3 is disposed in a third column 75. The fourth-first opening 48-1 connects the second opening 44 and the third opening 46 disposed in the first column 71, the fourth-second opening 48-2 connects the second opening 44 and the third opening 46 disposed in the second column 73, and the fourth-third opening 48-3 connects the second opening 44 and the third opening 46 disposed in the third column 75.

Referring to FIGS. 11 and 12, a length of the fourth-first opening 48-1 may be formed to be greater than a length of each of the fourth-second opening 48-2 and fourth-third opening 48-3, and the length of the fourth-second opening 48-2 may be formed to be shorter than the length of the fourth-third opening 48-3.

The second opening 44 and the third opening 46 connected by the fourth-first opening 48-1 in the first column 71, the second opening 44 and the third opening 46 connected by the fourth-second opening 48-2 in the second column 73, and the second opening 44 and the third opening 46 connected to the fourth-third opening 48-3 in the third column 75 may be formed to have different widths. For example, the second opening 44 and the third opening 46 that are formed in the first column 71 may be formed with a red light emitting layer, the second opening 44 and the third opening 46 that are formed in the second column 73 may be formed with a green light emitting layer, and the second opening 44 and the third opening 46 that are formed in the third column 75 may be formed with a blue light emitting layer. The difference between the widths of the second openings 44 respectively formed in the first to third columns 71, 73, and 75 and the difference between the widths of the third openings 46 respectively formed in the first to third columns 71, 73, and 75 may be adjusted according to emission characteristics of each light emitting layer.

In the second opening 44 of the first column 71 in which a red light emitting layer having the smallest width is formed, a large amount of a red organic light emitting material relative to a surface area is dropped, so that the degree of the above-described dewetting phenomenon at the edge portion is relatively low. Thus, the length of a path through which the organic light emitting material moves due to the capillary phenomenon is increased by forming the length of the fourth-first opening 48-1 of the first column 71 in which the red light emitting layer is formed to be the longest, so that the amount of the organic light emitting material filling the second opening 44 is reduced.

Further, in the second opening 44 of the second column 73, in which the green light emitting layer is formed and which has a relatively greater width than the second opening 44 of the first column 71 in which the red light emitting layer is formed, a small amount of a green organic light emitting material relative to a surface area is dropped, so that the dewetting phenomenon at the edge portion occurs relatively severely. Accordingly, the length of a path through which the organic light emitting material moves due to the capillary phenomenon is decreased by forming the length of the fourth-second opening 48-2 of the second column 73, in which the green light emitting layer is formed, to be less than that of the fourth-first opening 48-1, so that the amount of the organic light emitting material filling the second opening 44 is increased.

Further, in the second opening 44 of the third column 75, in which the blue light emitting layer is formed and which has a relatively greater width than the second opening 44 of the second column 74 in which the green light emitting layer is formed, a small amount of a blue organic light emitting material relative to a surface area is dropped, so that the dewetting phenomenon at the edge portion occurs most severely. However, the visibility of a dewetting phenomenon of a blue color is relatively lower than that of a green color. Thus, the path through which the organic light emitting material moves due to the capillary phenomenon may be adjusted by forming the fourth-third opening 48-3 of the third column 75 in which the blue light emitting layer is formed to be shorter than the fourth-first opening 48-1 and to be longer than the fourth-second opening 48-2, and accordingly, the amount of the organic light emitting material filling the second opening 44 may be adjusted.

The organic light emitting display device 300 according to the third embodiment of the present disclosure has an advantage of remarkably improving display quality deterioration due to the thickness variation of the organic light emitting layer according to position by adjusting the length of each of the fourth-first to fourth-third openings 48-1 to 48-3 in consideration of the fact that the visibility of the dewetting phenomenon differs for each color emitted by the organic light emitting layer.

Alternatively, when the fourth-first opening 48-1, the fourth-second opening 48-2 and the fourth-third opening 48-3 have the same length (in a vertical direction), the fourth-third opening 48-3 may have a width (in a horizontal direction) being greater than the fourth-first opening 48-1 and smaller than the fourth-second opening 48-2.

Fourth Embodiment

Figure 13:
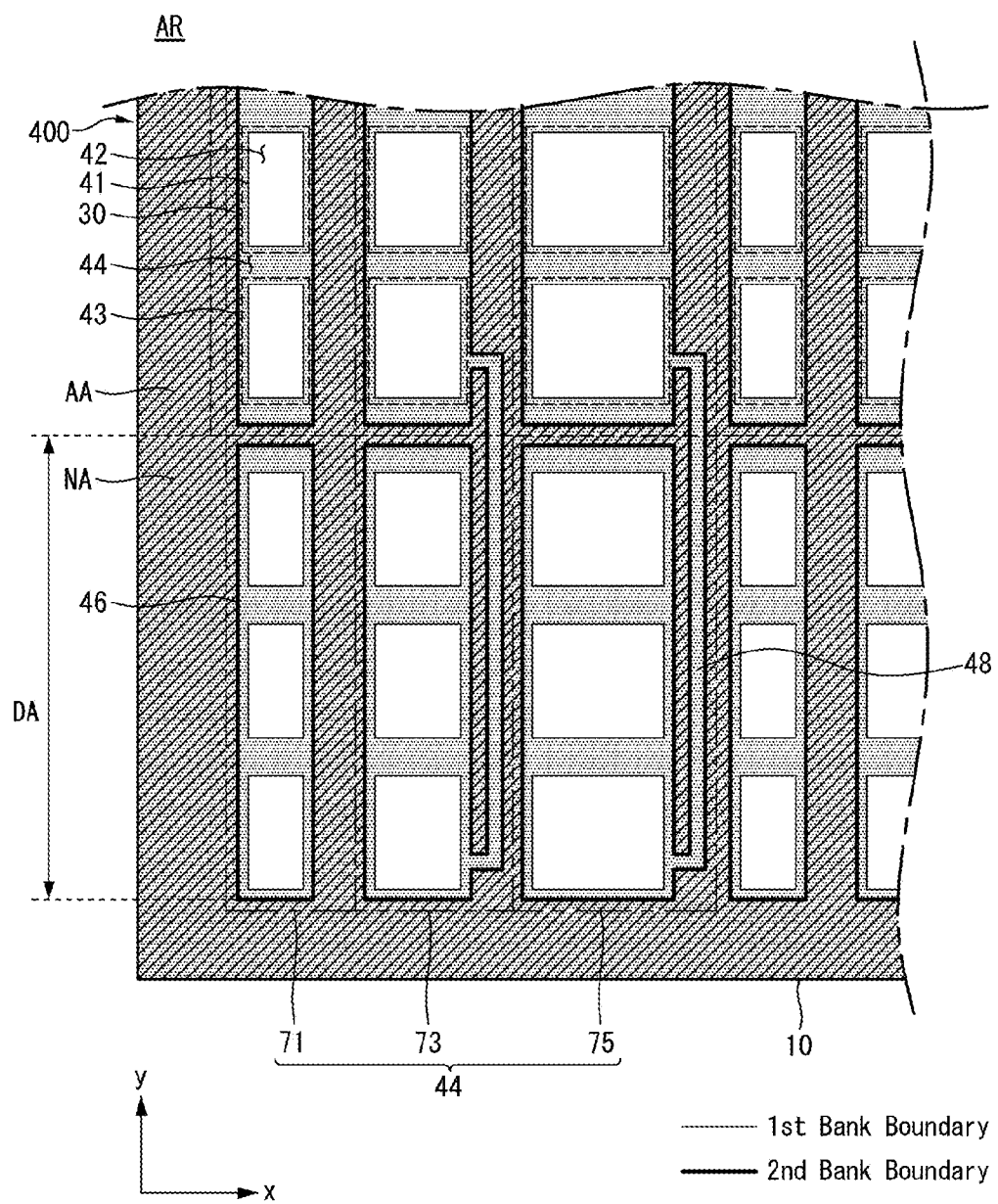
FIG. 13 is an enlarged plan view of the area AR of FIG. 1 schematically illustrating an organic light emitting display device according to a fourth embodiment of the present disclosure.
Figure 14:
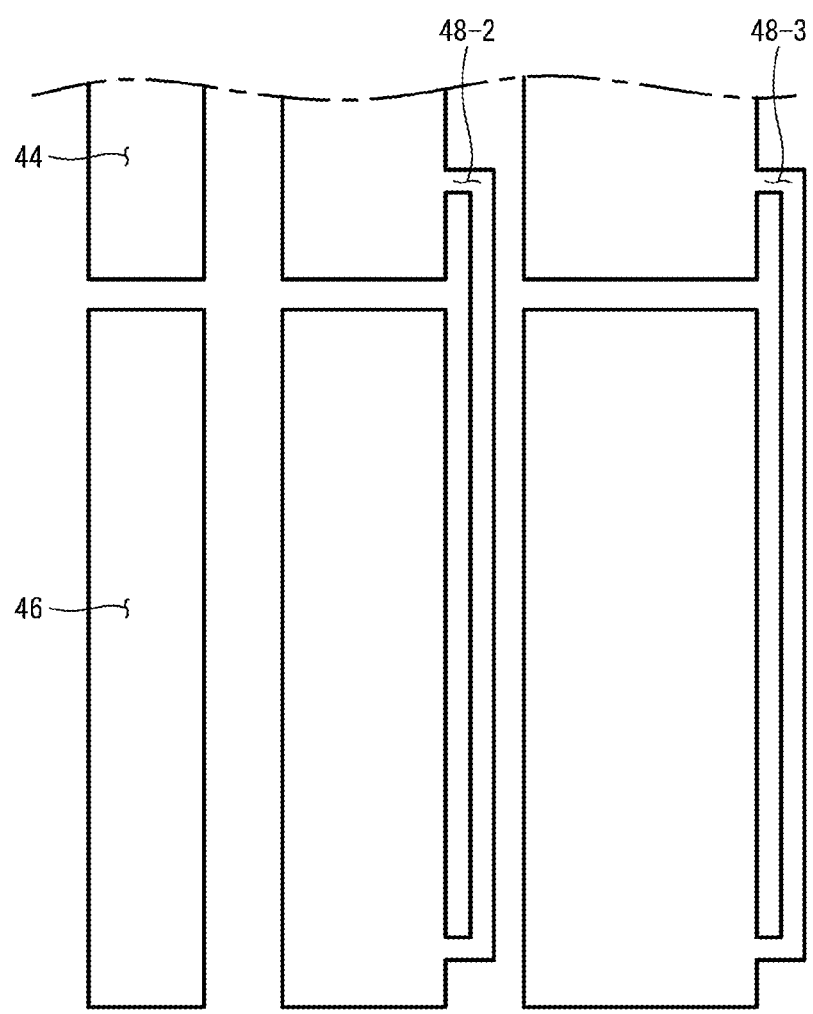
FIG. 14 is a plan view illustrating second openings, third openings, and fourth openings of the organic light emitting display device according to the fourth embodiment of the present disclosure.

FIG. 13 is an enlarged plan view of the area AR of FIG. 1 schematically illustrating an organic light emitting display device according to a fourth embodiment of the present disclosure. FIG. 14 is a plan view illustrating second openings, third openings, and fourth openings of the organic light emitting display device according to the fourth embodiment of the present disclosure.

Referring to FIG. 13, an organic light emitting display device 400 according to the fourth embodiment of the present disclosure includes a substrate 10 having a display area AA in which sub-pixels SP are arranged and a non-display area NA outside the display area AA. Although not shown in the drawings, a circuit layer 20 including a transistor 21, a passivation film 27, and an overcoat layer 28 may be provided on the substrate 10 similar to the second embodiment described above.

Specifically, the sub-pixels SP may be arranged in the first direction and the second direction which intersect each other. A first electrode 30 of an OLED is disposed in the sub-pixels SP. One first electrode 30 may be assigned per sub-pixel SP.

A bank 40 is disposed on the first electrode 30. The bank 40 includes a first bank 41 and a second bank 43.

The first bank 41 is positioned on the first electrode 30. The first bank 41 includes first openings 42 exposing at least some of the first electrode 30, and may have a hydrophilic property. The first bank 41 is formed over the entirety of the display area AA and the non-display area NA.

The non-display area NA may further include a dummy area DA. The dummy area DA is an area adjacent to the display area AA in the second direction. The second bank 43 is positioned on the substrate 10 on which the first bank 41 is formed. The second bank 43 includes second openings 44 exposing at least some of the first electrode 30. A plurality of the second openings 44 are arranged side by side in the first direction and extended in the second direction. The second openings 44 are extended in the second direction, and expose a plurality of first electrodes 30 disposed in the second direction. Alternatively, the second openings 44 are extended in the second direction, and expose a plurality of first openings 42 disposed in the second direction. The second bank 43 may have a hydrophobic property.

The second opening 44 is positioned to be outwardly spaced apart from the first opening 42. That is, the boundary of the first bank 41 is spaced apart from the boundary of the second bank 43 by a predetermined interval. Thus, the first opening 42 may be exposed by the second opening 44. The second bank 43 is disposed in the display area AA, and the second openings 44 expose the plurality of first electrodes 30 arranged in the display area AA.

The second bank 43 includes third openings 46 disposed in the non-display area NA. The third opening 46 is formed in the dummy area DA of the non-display area NA, and exposes the first bank 41 disposed in the dummy area DA. The third opening 46 is extended and disposed in the second direction identical to a direction in which the second opening 44 is extended. The third opening 46 is separated from the second opening 44 by the second bank 43 and disposed to be spaced apart therefrom.

The second bank 43 includes fourth openings 48 connecting the second openings 44 and the third openings 46. The fourth opening 48 is branched from the second opening 44 and connected to the third opening 46 that is formed to be collinear with the second opening 44. For example, the fourth opening 48 is branched from each of the second opening 44 and the third opening 46, and extended to connect the second opening 44 and the third opening 46. The fourth opening 48 is branched from each of the second opening 44 and the third opening 46, and disposed over the display area AA and the non-display area NA. The fourth opening 48 is disposed in the second bank 43 formed between the adjacent third openings 46.

An organic light emitting material of the same color is dropped on the plurality of first electrodes 30 exposed by the second openings 44. This means that light of the same color is emitted from a plurality of sub-pixels SP allocated to a position corresponding to one second opening 44. In addition, an organic light emitting material of the same color is also dropped into the third opening 46 extending in the same direction as the second opening 44, and fills the fourth opening 48 connected to the second opening 44 and the third opening 46. The planar shape of the organic light emitting layer 50 may correspond to the planar shape of the second opening 44.

Organic light emitting materials of different colors may be sequentially and alternately dropped into the corresponding second opening 44 and third opening 46. The organic light emitting materials of different colors may include organic light emitting materials which emit red (R), green (G), and blue (B), and as necessary, may further include an organic light emitting material which emits white (W).

The second bank 43 is positioned between the first electrodes 30 adjacent to each other in the first direction and prevents differently colored organic light emitting materials dropped into the corresponding second opening 44 and third opening 46 adjacent to each other in the first direction from being mixed. That is, differently colored organic light emitting materials dropped into the corresponding second opening 44 and third opening 46 are physically separated by the second bank 43.

As described above, in the fourth embodiment of the present disclosure, the fourth opening 48 connecting the second opening 44 and the third opening 46 may be provided.

Specifically, the second openings 44, the third openings 46, and the fourth openings 48 of the second bank 43 include a first column 71, a second column 73, and a third column 75 that include different organic light emitting layers. The first column 71 is an area in which the organic light emitting layer displaying any one color is formed in the second opening 44 and the third opening 46 that are arranged in the second direction. The second column 73 is an area which is spaced apart from the first column 71 by a small gap and in which the organic light emitting layer displaying a color different from that of the organic light emitting layer formed in the first column 71 is formed. The third column 75 is an area which is spaced apart from the second column 73 by a small gap and in which the organic light emitting layer displaying a color different from those of the organic light emitting layers formed in the first column 71 and the second column 73 is formed.

In the organic light emitting display device 400 according to the fourth embodiment of the present disclosure, the second bank 43 includes the second opening 44, the third opening 46, and the fourth opening 48 connecting the second opening 44 and the third opening 46. For example, the fourth opening 48 is formed over the display area AA and the non-display area NA by connecting the second opening 44 formed in the display area AA and the third opening 46 formed in the non-display area NA. The fourth opening 48 is formed in a shape branching from each of the second opening 44 and the third opening 46 in the first direction and extending in the second direction.

The fourth opening 48 is formed to have a width smaller than that of each of the second opening 44 disposed in the display area AA and the third opening 46 disposed in the non-display area NA. Since the fourth opening 48 is formed to have a width smaller than those of the second opening 44 and the third opening 46, when the organic light emitting material is dropped and spread evenly in the second opening 44 and the third opening 46, a capillary phenomenon acts so that the organic light emitting material moves well through the fourth opening 48.

The organic light emitting display device 400 according to the fourth embodiment of the present disclosure may include the dummy area DA in the non-display area NA other than the display area AA, and include the fourth opening 48 connecting the third opening 46 disposed in the dummy area DA to the second opening 44 disposed in the display area AA. When the organic light emitting material dropped into the second opening 44 disposed in an edge portion of the display area AA is rapidly dried, and the organic light emitting material aggregates at a central portion of the display area AA, the organic light emitting material, which is dropped into the third opening 46 disposed in the dummy area DA, fills the second opening 44 through the fourth opening 48. That is, since the organic light emitting material is continuously supplied to the second opening 44 disposed at the edge portion of the display area AA, the amount of the organic light emitting material of the second opening 44 disposed at the edge portion may be maintained to some extent. Accordingly, the organic light emitting layer formed after the organic light emitting material is dried may have a uniform thickness at the edge portion and the central portion of the display area AA, so that luminance non-uniformity may be prevented or minimized, thereby improving display quality.

In the organic light emitting display device 400 according to the fourth embodiment of the present disclosure, a fourth-first opening 48-1 is not disposed in the first column 71, and a fourth-second opening 48-2 is disposed in the second column 73, and the fourth-third opening 48-3 is disposed in the third column 75. The fourth-second opening 48-2 connects the second opening 44 and the third opening 46 disposed in the second column 73, and the fourth-third opening 48-3 connects the second opening 44 and the third opening 46 disposed in the third column 75.

Referring to FIGS. 13 and 14, the lengths of the fourth-second opening 48-2 and the fourth-third opening 48-3 may be formed to be the same. In this case, a width of the fourth-second opening 48-2 may be greater than a width of the fourth-third opening 48-3. Alternatively, the length of the fourth-second opening 48-2 may be shorter than the length of the fourth-third opening 48-3. In this case, the fourth-second opening 48-2 and the fourth-third opening 48-3 may be the same width.

The second opening 44 and the third opening 46 in the first column 71, the second opening 44 and the third opening 46 connected by the fourth-second opening 48-2 in the second column 73, and the second opening 44 and the third opening 46 connected by the fourth-third opening 48-3 in the third column 75 may have different widths. For example, the second opening 44 and the third opening 46 that are formed in the first column 71 may be formed with a red light emitting layer, the second opening 44 and the third opening 46 that are formed in the second column 73 may be formed with a green light emitting layer, and the second opening 44 and the third opening 46 that are formed in the third column 75 may be formed with a blue light emitting layer. The difference between the widths of the second openings 44 respectively formed in the first to third columns 71, 73, and 75 and the difference between the widths of the third openings 46 respectively formed in the first to third columns 71, 73, and 75 may be adjusted according to emission characteristics of each light emitting layer.

In the second opening 44 of the first column 71 in which a red light emitting layer having the smallest width is formed, a large amount of a red organic light emitting material relative to a surface area is dropped, so that the degree of dewetting phenomenon at the edge portion is relatively low, and visibility is low due to the characteristic of a red color. Accordingly, the fourth-first opening 48-1 of the first column 71 in which a red light emitting layer is formed is not provided.

A small amount of a green organic light emitting material relative to a surface area is dropped into the second opening 44 of the second column 73 in which the green light emitting layer having a great width is formed, so that the dewetting phenomenon at the edge portion is relatively severe. Accordingly, the organic light emitting material fills the second opening 44 due to the capillary phenomenon by providing the fourth-second opening 48-2 of the second column 73 in which the green light emitting layer is formed.

Further, in the second opening 44 of the third column 75, in which the blue light emitting layer is formed and which has a relatively greater width than the second opening 44 of the second column 74 in which the green light emitting layer is formed, a small amount of a blue organic light emitting material relative to a surface area is dropped, so that the dewetting phenomenon at the edge portion occurs most severely. However, the visibility of a dewetting phenomenon of a blue color is relatively lower than that of a green color. Accordingly, the length of a path through which the organic light emitting material moves due to the capillary phenomenon is adjusted by forming the length of the fourth-third opening 48-3 of the third column 75 in which the blue light emitting layer is formed to be equal to that of the fourth-second opening 48-2, so that the amount of the organic light emitting material filling the second opening 44 is adjusted.

The organic light emitting display device 400 according to the fourth embodiment of the present disclosure has an advantage of remarkably improving display quality deterioration due to the thickness variation of the organic light emitting layer according to position by including the fourth-second opening in the second column and the fourth-third opening in the third column but not including the fourth-first opening in the first column in consideration of the fact that the visibility of the dewetting phenomenon differs for each color emitted by the organic light emitting layer.

Fifth Embodiment

Figure 15:
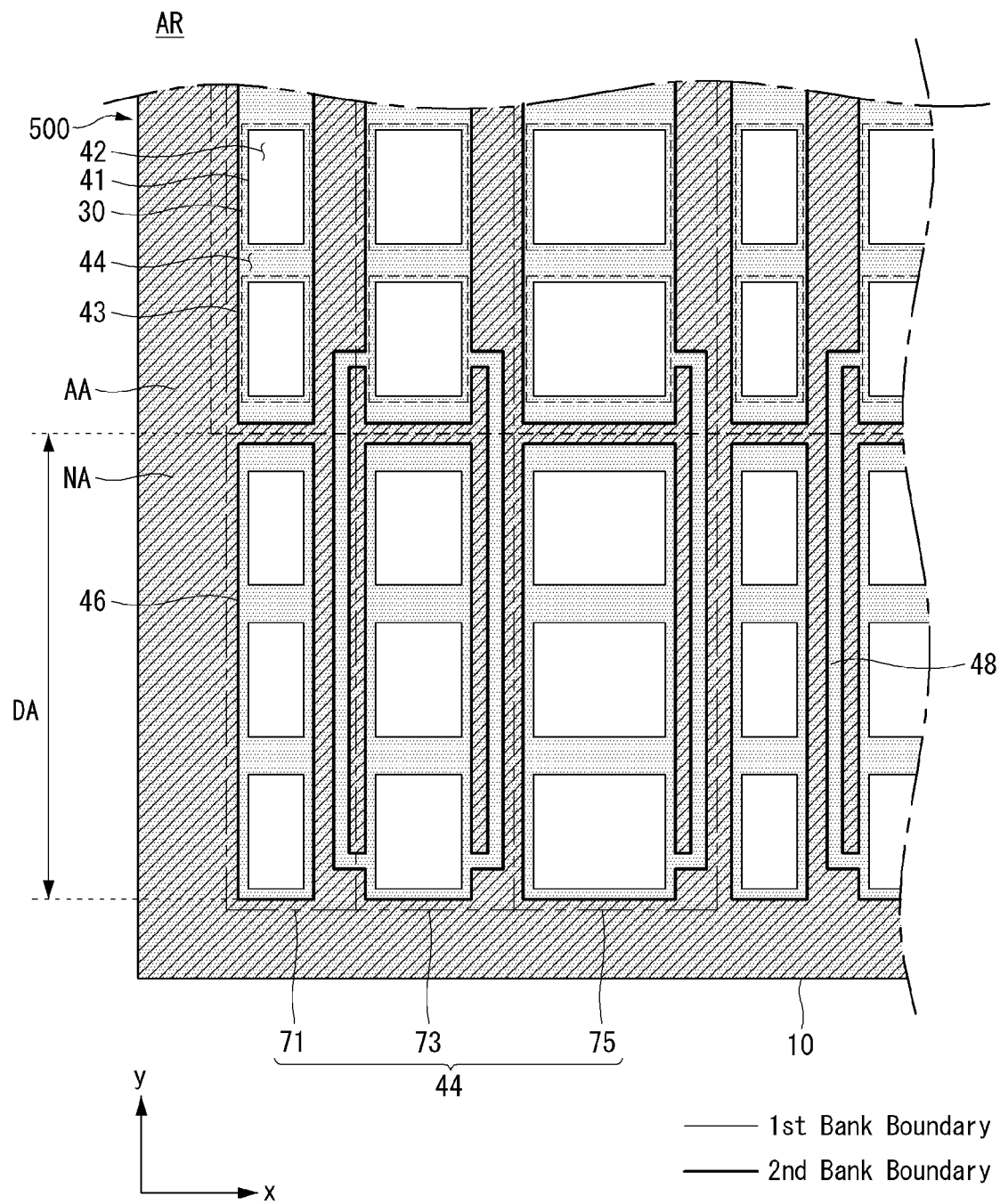
FIG. 15 is an enlarged plan view of the area AR of FIG. 1 schematically illustrating an organic light emitting display device according to a fifth embodiment of the present disclosure.
Figure 16:
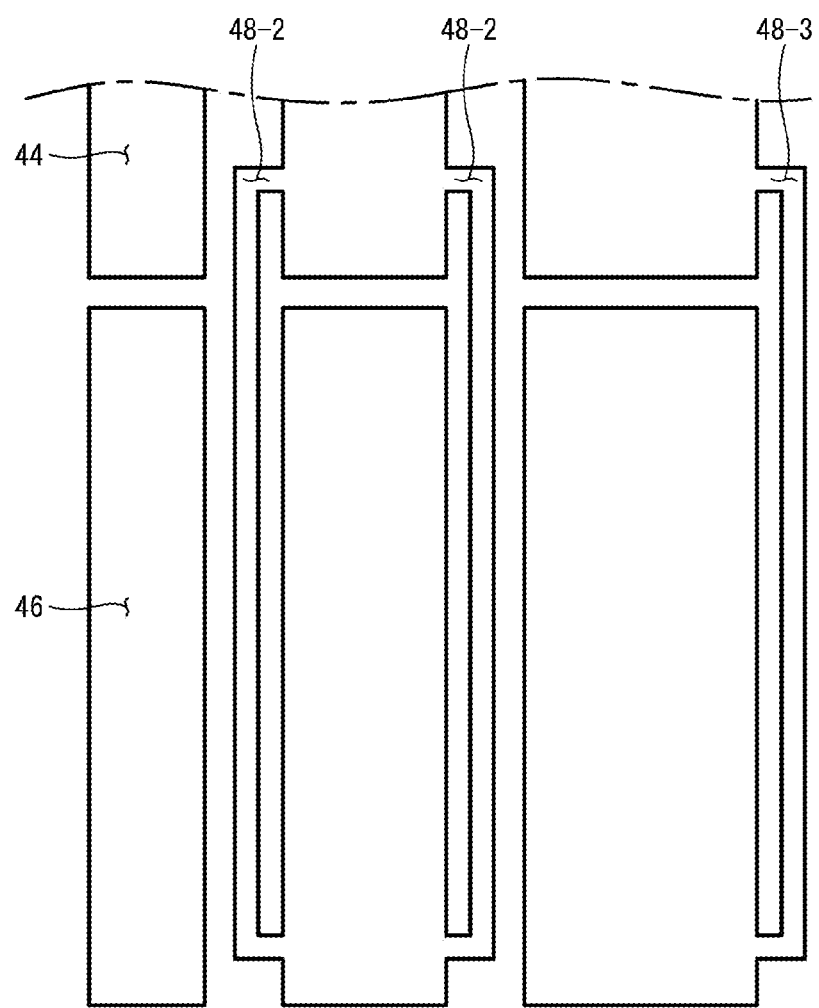
FIG. 16 is a plan view illustrating second openings, third openings, and fourth openings of the organic light emitting display device according to the fifth embodiment of the present disclosure.

FIG. 15 is an enlarged plan view of the area AR of FIG. 1 schematically illustrating an organic light emitting display device according to a fifth embodiment of the present disclosure. FIG. 16 is a plan view illustrating second openings, third openings, and fourth openings of the organic light emitting display device according to the fifth embodiment of the present disclosure.

Referring to FIG. 15, an organic light emitting display device 500 according to the fifth embodiment of the present disclosure includes a substrate 10 having a display area AA in which sub-pixels SP are arranged and a non-display area NA outside the display area AA. Although not shown in the drawings, a circuit layer 20 including a transistor 21, a passivation film 27, and an overcoat layer 28 may be provided on the substrate 10 similar to the second embodiment described above.

The sub-pixels SP may be arranged in the first direction and the second direction which intersect each other. A first electrode 30 of an OLED is disposed in the sub-pixels SP. One first electrode 30 may be assigned per sub-pixel SP.

A bank 40 is disposed on the first electrode 30. The bank 40 includes a first bank 41 and a second bank 43.

The first bank 41 is positioned on the first electrode 30. The first bank 41 includes first openings 42 exposing at least some of the first electrode 30, and may have a hydrophilic property. The first bank 41 is formed over the entirety of the display area AA and the non-display area NA. The non-display area NA may further include a dummy area DA. The dummy area DA is an area adjacent to the display area AA in the second direction.

The second bank 43 includes second openings 44 exposing at least some of the first electrode 30. A plurality of the second openings 44 are arranged side by side in the first direction and extended in the second direction. The second openings 44 are extended in the second direction, and expose a plurality of first electrodes 30 disposed in the second direction. Alternatively, the second openings 44 are extended in the second direction, and expose a plurality of first openings 42 disposed in the second direction. The second bank 43 may have a hydrophobic property.

The second opening 44 is positioned to be outwardly spaced apart from the first opening 42. That is, the boundary of the first bank 41 is spaced apart from the boundary of the second bank 43 by a predetermined interval. Thus, the first opening 42 may be exposed by the second opening 44. The second bank 43 is disposed in the display area AA, and the second openings 44 expose the plurality of first electrodes 30 arranged in the display area AA.

The second bank 43 includes third openings 46 disposed in the non-display area NA. The third opening 46 is formed in the dummy area DA of the non-display area NA and exposes the first bank 41 disposed in the dummy area DA. The third opening 46 is extended and disposed in the second direction identical to a direction in which the second opening 44 is extended. The third opening 46 is separated from the second opening 44 by the second bank 43 and disposed to be spaced apart therefrom.

The second bank 43 includes fourth openings 48 connecting the second openings 44 and the third openings 46. The fourth opening 48 is branched from the second opening 44 and connected to the third opening 46 that is formed to be collinear with the second opening 44. For example, the fourth opening 48 is branched from each of the second opening 44 and the third opening 46 and is extended to connect the second opening 44 and the third opening 46. The fourth opening 48 is branched from each of the second opening 44 and the third opening 46, and disposed over the display area AA and the non-display area NA. The fourth opening 48 is disposed in the second bank 43 formed between the adjacent third openings 46.

An organic light emitting material of the same color is dropped on the plurality of first electrodes 30 exposed by the second opening 44. This means that light of the same color is emitted from a plurality of sub-pixels SP allocated to a position corresponding to one second opening 44. In addition, an organic light emitting material of the same color is also dropped into the third opening 46 extending in the same direction as the second opening 44, and fills the fourth opening 48 connected to the second opening 44 and the third opening 46. The planar shape of the organic light emitting layer 50 may correspond to the planar shape of the second opening 44.

Organic light emitting materials of different colors may be sequentially and alternately dropped into the corresponding second opening 44 and third opening 46. The organic light emitting materials of different colors may include organic light emitting materials which emit red (R), green (G), and blue (B), and as necessary, may further include an organic light emitting material which emits white (W).

The second bank 43 is positioned between the first electrodes 30 adjacent to each other in the first direction and prevents differently colored organic light emitting materials dropped into the corresponding second opening 44 and third opening 46 adjacent to each other in the first direction from being mixed. That is, differently colored organic light emitting materials dropped into the corresponding second opening 44 and third opening 46 are physically separated by the second bank 43.

As described above, the organic light emitting display device 500 according to the fifth embodiment of the present disclosure may include the fourth opening 48 connecting the second opening 44 and the third opening 46.

Specifically, the second openings 44, the third openings 46, and the fourth openings 48 of the second bank 43 include a first column 71, a second column 73, and a third column 75 that include different organic light emitting layers. The first column 71 is an area in which the organic light emitting layer displaying any one color is formed in the second opening 44 and the third opening 46 that are arranged in the second direction. The second column 73 is an area which is spaced apart from the first column 71 by a small gap and in which the organic light emitting layer displaying a color different from that of the organic light emitting layer formed in the first column 71 is formed. The third column 75 is an area which is spaced apart from the second column 73 by a small gap and in which the organic light emitting layer displaying a color different from those of the organic light emitting layers formed in the first column 71 and the second column 73 is formed.

In the organic light emitting display device 500 according to the fifth embodiment of the present disclosure, the second bank 43 includes the second opening 44, the third opening 46, and the fourth opening 48 connecting the second opening 44 and the third opening 46. For example, the fourth opening 48 is formed over the display area AA and the non-display area NA by connecting the second opening 44 formed in the display area AA and the third opening 46 formed in the non-display area NA. The fourth opening 48 is formed in a shape branching from each of the second opening 44 and the third opening 46 in the first direction and extending in the second direction.

The fourth opening 48 is formed to have a width smaller than that of each of the second opening 44 disposed in the display area AA and the third opening 46 disposed in the non-display area NA. Since the fourth opening 48 is formed to have a width smaller than those of the second opening 44 and the third opening 46, when the organic light emitting material is dropped and spread evenly in the second opening 44 and the third opening 46, a capillary phenomenon acts so that the organic light emitting material moves well through the fourth opening 48.

The organic light emitting display device 500 according to the fifth embodiment of the present disclosure may include the dummy area DA in the non-display area NA other than the display area AA, and include the fourth opening 48 connecting the third opening 46 disposed in the dummy area DA to the second opening 44 disposed in the display area AA. When the organic light emitting material dropped into the second opening 44 disposed in the edge portion of the display area AA is rapidly dried, and the organic light emitting material aggregates at a central portion of the display area AA, the organic light emitting material, which is dropped into the third opening 46 disposed in the dummy area DA, fills the second opening 44 through the fourth opening 48. That is, since the organic light emitting material is continuously supplied to the second opening 44 disposed at the edge portion of the display area AA, the amount of the organic light emitting material of the second opening 44 disposed at the edge portion may be maintained to some extent. Accordingly, the organic light emitting layer formed after the organic light emitting material is dried may have a uniform thickness at the edge portion and the central portion of the display area AA, so that luminance non-uniformity may be prevented or reduced, thereby improving display quality.

In the organic light emitting display device 500 according to the fifth embodiment of the present disclosure, a fourth-first opening 48-1 is not disposed in the first column 71, and a fourth-second opening 48-2 is disposed in a second column 73, and a fourth-third opening 48-3 is disposed in a third column 75. As shown in the drawings, a plurality of fourth-second openings 48-2 may be disposed in the second column 73, and the fourth-third opening 48-3 may be disposed in the third column 75 in a number less than the number of fourth-second openings 48-2 of the second column 73. The plurality of fourth-second openings 48-2 connect the second opening 44 and the third opening 46 disposed in the second column 73, and the fourth-third opening 48-3 connects the second opening 44 and the third opening 46 disposed in the third column 75.

Referring to FIGS. 15 and 16, the fourth-third opening 48-3 may be disposed in the third column 75 in a number less than the number of fourth-second openings 48-2 of the second column 73. That is, the fourth-second opening 48-2 of the second column 73 may be provided in a number greater than the number of fourth-third openings 48-3 of the third column 75. For example, one of the fourth-second openings 48-2 is positioned between the third opening 46 (or the second opening 44) in the first column 71 and the third opening 46 (or the second opening 44) in the second column 73, and the other one of the fourth-second openings 48-2 is positioned between the third opening 46 (or the second opening 44) in the second column 73 and the third opening 46 (or the second opening 44) in the third column 75. The fourth-third opening 48-3 is positioned between the third opening 46 (or the second opening 44) in the third column 73 and the third opening 46 (or the second opening 44) in the first column 71.

The second opening 44 and the third opening 46 in the first column 71, the second opening 44 and the third opening 46 connected by the fourth-second opening 48-2 in the second column 73, and the second opening 44 and the third opening 46 connected by the fourth-third opening 48-3 in the third column 75 may have different widths. For example, the second opening 44 and the third opening 46 that are formed in the first column 71 may be formed with a red light emitting layer, the second opening 44 and the third opening 46 that are formed in the second column 73 may be formed with a green light emitting layer, and the second opening 44 and the third opening 46 that are formed in the third column 75 may be formed with a blue light emitting layer. The difference between the widths of the second openings 44 respectively formed in the first to third columns 71, 73, and 75 and the difference between the widths of the third openings 46 respectively formed in the first to third columns 71, 73, and 75 may be adjusted according to emission characteristics of each light emitting layer.

In the second opening 44 of the first column 71 in which a red light emitting layer having the smallest width is formed, a large amount of a red organic light emitting material relative to a surface area is dropped, so that the degree of dewetting phenomenon at an edge portion is relatively low, and visibility is low due to the characteristic of a red color. Accordingly, the fourth-first opening 48-1 of the first column 71 in which a red light emitting layer is formed is not provided.

In the second opening 44 of the second column 73, in which the green light emitting layer is formed and which has a relatively greater width than the second opening 44 of the first column 71 in which the red light emitting layer is formed, a small amount of a green organic light emitting material relative to a surface area is dropped, so that the dewetting phenomenon at the edge portion occurs relatively severely. Accordingly, the organic light emitting material rapidly fills the second opening 44 due to the capillary phenomenon by providing the plurality of fourth-second openings 48-2 of the second column 73 in which the green light emitting layer is formed.

Further, in the second opening 44 of the third column 75, in which the blue light emitting layer is formed and which has a relatively greater width than the second opening 44 of the second column 74 in which the green light emitting layer is formed, a small amount of a blue organic light emitting material relative to a surface area is dropped, so that the dewetting phenomenon at the edge portion occurs most severely. However, the visibility of a dewetting phenomenon of a blue color is relatively lower than that of a green color. Accordingly, the length of a path through which the organic light emitting material moves due to the capillary phenomenon is adjusted by forming the fourth-third opening 48-3 of the third column 75 in which the blue light emitting layer is formed in a number less than the number of fourth-second openings 48-2 is adjusted, so that the amount of the organic light emitting material filling the second opening 44 is adjusted.

The organic light emitting display device 500 according to the fifth embodiment of the present disclosure has an advantage of remarkably improving display quality deterioration due to the thickness variation of the organic light emitting layer according to position by including the fourth-second opening of the second column in a number greater than the number of fourth-third openings of the third column and not including the fourth-first opening in the first column in consideration of the fact that the visibility of the dewetting phenomenon differs for each color emitted by the organic light emitting layer.

Those skilled in the art may change and modify the present disclosure in various ways without departing from the technical spirit of the present disclosure through the above description. Accordingly, the technical range of the present disclosure should not be limited to the detailed contents of the specification, but should be determined by the claims.

What is claimed is:

1. An organic light emitting display device comprising:
a substrate including a display area and a non-display area at a periphery of the display area, the display area including a plurality of sub-pixels;
an overcoat layer disposed on the substrate;
a plurality of first electrodes disposed on the overcoat layer and in the plurality of sub-pixels;
a first bank disposed in the display area and the non-display area and the first bank including a plurality of first openings that expose the plurality of first electrodes in the display area, the plurality of first openings in the display area and the non-display area;
a second bank disposed on the first bank and the second bank including second openings that are in the display area but not the non-display area, third openings that are in the non-display area but not the display area, and fourth openings that extend from the display area to the non-display area, the second openings exposing the plurality of first electrodes arranged in the display area, the third openings exposing the first openings arranged in the non-display area, and a fourth opening from the fourth openings connecting a second opening from the second openings in the display area to a third opening from the third openings in the non-display area; and
an organic light emitting layer disposed in each of the second openings in the display area, the third openings in the non-display area, and the fourth openings that extend from the display area to the non-display area,
wherein the organic light emitting layer in the second opening contacts the first electrode, and the organic light emitting layer in the third opening contacts the overcoat layer.

2. The organic light emitting display device of claim 1, wherein another second opening from the second openings is separated from another third opening from the third openings by the second bank.

3. The organic light emitting display device of claim 1, wherein
the fourth opening is branched from the second opening and the third opening, and the fourth opening includes a portion that is collinear with the second opening and at least one of the third openings to connect the second opening and the third opening.

4. The organic light emitting display device of claim 1, wherein the organic light emitting layer includes a first organic light emitting layer of a first color in a second opening and a third opening in a first column, and the organic light emitting layer includes a second organic light emitting layer of a second color in a second opening and a third opening in a second column, and the organic light emitting layer includes a third organic light emitting layer of a third color in a second opening and a third opening in a third column.

5. The organic light emitting display device of claim 4, wherein the fourth opening connecting the second opening and the third opening is presented in at least one of the first column to third column.

6. The organic light emitting display device of claim 5, wherein each of the second opening and the third opening extends in a first direction, and the fourth opening is branched from each of the second opening and the third opening in a second direction and the fourth opening includes a portion that extends in the first direction.

7. The organic light emitting display device of claim 5, wherein the fourth opening includes a fourth-first opening connecting the second opening and the third opening disposed in the first column, a fourth-second opening connecting the second opening and the third opening disposed in the second column, and a fourth-third opening connecting the second opening and the third opening disposed in the third column.

8. The organic light emitting display device of claim 7, wherein a length of the fourth-first opening is longer than a length of each of the fourth-second opening and the fourth-third opening, and the length of the fourth-second opening is shorter than the length of the fourth-third opening.

9. The organic light emitting display device of claim 7, wherein a length of the fourth-first opening is equal to a length of each of the fourth-second opening and the fourth-third opening.

10. The organic light emitting display device of claim 5, wherein the fourth opening connecting the second opening and the third opening, which are disposed in at least one of the first column to the third column, is not disposed in the first column, and includes a fourth-second opening connecting the second opening and the third opening disposed in the second column and a fourth-third opening connecting the second opening and the third opening disposed in the third column.

11. The organic light emitting display device of claim 10, wherein at least two fourth-second openings are disposed, and a number of fourth-second openings is greater than a number of fourth-third openings.

12. The organic light emitting display device of claim 6, wherein a width of the fourth opening is less than a width of each of the second and third openings.

13. The organic light emitting display device of claim 7, wherein a width of the fourth-first opening is smaller than a width of each of the fourth-second opening and the fourth-third opening, and the width of the fourth-second opening is greater than the width of the fourth-third opening.

14. The organic light emitting display device of claim 7, wherein a width of the fourth-first opening is equal to a width of each of the fourth-second opening and the fourth-third opening.

15. The organic light emitting display device of claim 10, wherein a width of the fourth-second opening is greater than a width of the fourth-third opening.

16. The organic light emitting display device of claim 1, wherein the first bank has a hydrophilic property, and the second bank has a hydrophobic property.

17. The organic light emitting display device of claim 1, wherein the organic light emitting layer in the fourth opening contacts the first bank.

18. The organic light emitting display device of claim 1, wherein the second bank extends along a first direction,
wherein the fourth opening passes through the second bank and has a width in a second direction being smaller than a width of the second bank in the second direction, and wherein the second direction is perpendicular to the first direction.

* * * * *